United States Patent
Crego et al.

(10) Patent No.: US 11,741,274 B1
(45) Date of Patent: Aug. 29, 2023

(54) PERCEPTION ERROR MODEL FOR FAST SIMULATION AND ESTIMATION OF PERCEPTION SYSTEM RELIABILITY AND/OR FOR CONTROL SYSTEM TUNING

(71) Applicant: Zoox, Inc., Foster City, CA (US)

(72) Inventors: Andrew Scott Crego, Foster City, CA (US); Sai Anurag Modalavalasa, Foster City, CA (US); Subhasis Das, Menlo Park, CA (US); Siavosh Rezvan Behbahani, San Francisco, CA (US); Aditya Pramod Khadilkar, Foster City, CA (US)

(73) Assignee: Zoox, Inc., Foster City, CA (US)

( * ) Notice: Subject to any disclaimer, the term of this patent is extended or adjusted under 35 U.S.C. 154(b) by 356 days.

(21) Appl. No.: 17/100,787

(22) Filed: Nov. 20, 2020

(51) Int. Cl.
　　G06F 30/20　　(2020.01)
　　G06F 30/15　　(2020.01)
　　G06N 7/01　　(2023.01)

(52) U.S. Cl.
　　CPC .............. *G06F 30/20* (2020.01); *G06F 30/15* (2020.01); *G06N 7/01* (2023.01)

(58) Field of Classification Search
　　CPC .......... G06F 30/20; G06F 30/15; G06N 7/005
　　See application file for complete search history.

(56) References Cited

U.S. PATENT DOCUMENTS

| | | | |
|---|---|---|---|
| 2016/0293133 A1* | 10/2016 | Dutt | ......................... A63F 13/57 |
| 2017/0132334 A1* | 5/2017 | Levinson | .............. G01S 17/931 |
| 2017/0329332 A1* | 11/2017 | Pilarski | ............... B60W 30/095 |
| 2019/0049958 A1 | 2/2019 | Liu | |
| 2021/0276572 A1 | 9/2021 | Du | |
| 2021/0312177 A1 | 10/2021 | Bansal | |
| 2021/0316755 A1 | 10/2021 | Liu | |
| 2022/0153310 A1 | 5/2022 | Yang | |
| 2022/0172390 A1 | 6/2022 | Redford et al. | |
| 2022/0269279 A1 | 8/2022 | Redford | |

OTHER PUBLICATIONS

Zee EL, Mohammadiha N, Schliep A. Statistical sensor modelling for autonomous driving using autoregressive input-output HMMs. In2018 21st International Conference on Intelligent Transportation Systems (ITSC) Nov. 4, 2018 (pp. 1331-1336). IEEE. (Year: 2018).*

(Continued)

*Primary Examiner* — Chuen-Meei Gan
(74) *Attorney, Agent, or Firm* — Lee & Hayes, P.C.

(57) ABSTRACT

Fast simulation of a scenario (e.g., simulating the scenario once as opposed to multiple times) to determine performance metric(s) of a configuration of one or more components of an autonomous vehicle may include training a perception error model based at least in part on a difference between a prediction output by a perception component associated with a future time and a perception output associated with that future time once that future time has arrived. A contour or heat map output by the perception error model may be used to determine one or more performance metric(s) associated with a component of the autonomous vehicle and identify which component may cause a degradation of a performance metric.

20 Claims, 6 Drawing Sheets

(56) References Cited

OTHER PUBLICATIONS

Althoff M, Mergel A. Comparison of Markov chain abstraction and Monte Carlo simulation for the safety assessment of autonomous cars. IEEE Transactions on Intelligent Transportation Systems. Jun. 13, 2011;12(4):1237-47. (Year: 2011).*
Rosique F, Navarro PJ, Fernandez C, Padilla A. A systematic review of perception system and simulators for autonomous vehicles research. Sensors. Feb. 5, 2019;19(3):648. (Year: 2019).*
Office Action for U.S. Appl. No. 17/100,793, dated Oct. 12, 2022, Crego, "Perception Error Model for Fast Simulation and Estimation of Perception System Reliability and/or for Control System Tuning", 12 pages.
Office Action for U.S. Appl. No. 17/100,793, dated Feb. 16, 2023, Crego, "Perception Error Model for Fast Simulation and Estimation of Perception System Reliability and/or for Control System Tuning", 24 pages.

\* cited by examiner

PERCEPTION ERROR MODEL FOR FAST SIMULATION AND ESTIMATION OF PERCEPTION SYSTEM RELIABILITY AND/OR FOR CONTROL SYSTEM TUNING

BACKGROUND

Running simulations of scenarios may provide a valuable method for testing autonomous systems and/or machine-learned model pipelines, such as those incorporated in autonomous vehicles. Ensuring that the simulations are thorough may involve running the same scenario with slight variations to ensure that a component of the tested system is safe and effectual. However, running multiple iterations of multiple scenarios may increase the computational use, time, memory, and energy to test autonomous systems by multiple orders of magnitude.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicate similar or identical items.

DETAILED DESCRIPTION

Figure 1:
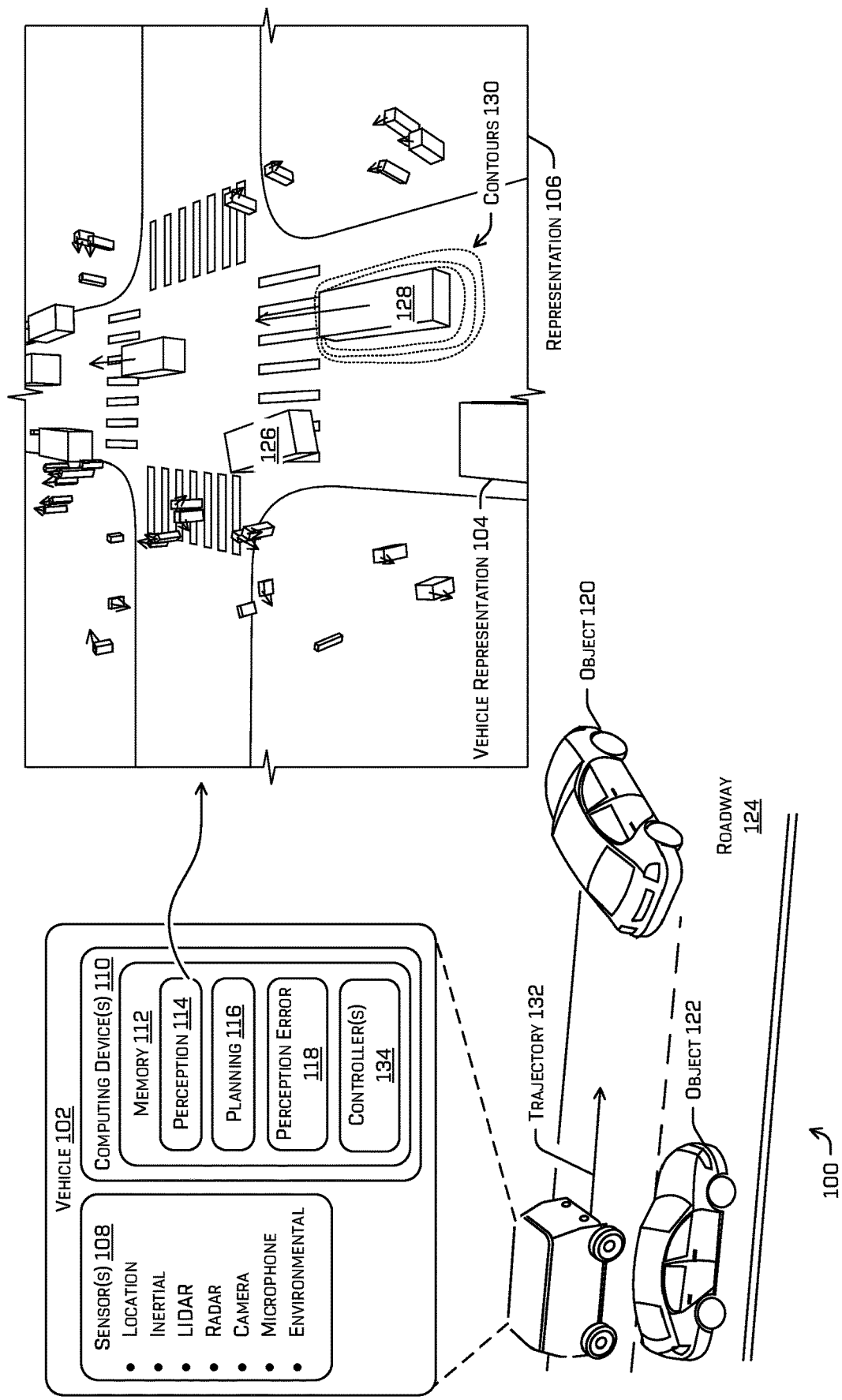
FIG. 1 illustrates an example scenario in which an autonomous vehicle comprising a perception error model may be controlled based at least in part on determining error data associated with an object detection using the perception error model.

Techniques described herein are directed to various aspects of using a perception error model to control an autonomous system, modify the autonomous system on-the-fly or based on a simulation, and/or reduce the time and computational load to determine performance metrics of an autonomous system using simulation(s). In at least some examples described herein, such performance metrics (e.g., estimated intersections per miles driven, time to complete mission, failure rate, reliability rate) may be determined, for example, using simulations in conjunction with other performance metric determinations. Simulations can be used to validate software (e.g., a vehicle controller) executed on vehicles (e.g., autonomous vehicles) and gather performance metrics (such as safety metrics) to ensure that the software is able to safely control such vehicles in various scenarios. In additional or alternative examples, simulations can be used to learn about the constraints of autonomous vehicles that use the autonomous controller. For instance, simulations can be used to understand the operational space of an autonomous vehicle (e.g., an envelope in which the autonomous controller effectively controls the autonomous vehicle) in view of surface conditions, ambient noise, faulty components, etc. Simulations can also be useful for generating feedback for improving operations and designs of autonomous vehicles. For instance, in some examples, simulations can be useful for determining an amount of redundancy that is required in an autonomous controller, how to modify a behavior of the autonomous controller based on what is learned through simulations, or whether the autonomous controller is ready to be deployed.

When creating a simulation environment to perform testing and validation, it is possible to specifically enumerate the environment with various specific examples. Each instantiation of such an environment can be unique and defined. Enumerating all possible scenarios manually can require inordinate amounts of time and, if not every possible scenario is constructed, various scenarios can go untested. Moreover, enumerating all possible scenarios for even a single type of scenario, may use an extensive amount of time and computational bandwidth. For example, to comprehensively test a simple scenario, such as approaching another vehicle from the rear, numerous minor variations must be made, such as changing the color of the vehicle, the light and/or weather conditions, etc. Permutations of these different variables may lead to exponential growth in the number of scenarios that must be simulated to exhaustively test the autonomous controller.

The techniques discussed herein comprise receiving a perception component of the autonomous controller and training a perception error model in association with the perception component. The perception component may be an updated version of a previous perception component and training the perception error model may include training a new perception error model in association with the updated version of perception component. In some examples, a new perception error model may be trained or alterations made to the former perception error model any time there is an update to the perception component. The perception error model may indicate a likelihood and/or an extent of an error associated with an output of the perception component. In at least one example, the perception component may comprise hardware and/or software for receiving sensor data from one or more sensors of an autonomous vehicle and detecting one or more objects in an environment associated with the autonomous vehicle and/or characteristics associated with the one or more objects. In some examples, the techniques discussed herein may additionally or alternatively be extended to a prediction component of the autonomous controller by training an error model in association with the prediction component and/or the perception component. As used herein, an object detection generated by the perception component may comprise any of the data generated by the perception component in relation to an object, such as a location, region of interest, heading, velocity, acceleration, classification (e.g., pedestrian, vehicle, signage), state (e.g., paying attention, moving erratically, indicating a green light), or the like. The perception error model may be trained to output a likelihood and/or extent to which an object detection generated by the perception component is in error (e.g., a percentage, a mean and/or standard deviation).

According to the techniques discussed herein, the perception error model may be used to expedite determining performance metrics associated with a new, modified, or existing perception component using simulation. The simulation may additionally or alternatively be used to tune the perception component and/or one or more other components of the autonomous vehicle based on the results of the simulation. For example, because of the complex interactions of different components of the autonomous vehicle, merely isolating each component and improving its functionality may not achieve the greatest performance of the vehicle. The techniques discussed herein provide a manner to quickly estimate the overall performance metrics of the vehicle (using the perception error model in part) and alter different component(s) of the autonomous vehicle to improve those performance metrics.

A first example of using simulation to test the perception component may include executing a simulation using "perfect" perception where, instead of using the perception component in the loop during simulation, the object detections are exact representations of simulated objects in the simulated environment based on the simulation data. The perception error model may be used to modify these perfect object detections, such as by completely deleting an object detection (false negative), adding an object detection not associated with any sensor data (or simulated sensor data) (false positive), or altering an object detection or other information determined about an object (e.g., by changing a characteristic associated with the object detection, such as a size of a region of interest (ROI) associated with an object detect, a velocity associated with the object). For example, the perception error model may be randomly sampled according to the trained parameters of the perception error model and the sampled values may be used to make the modifications. These modified object detections may then be provided to a planning component of the autonomous vehicle, which may control a simulation of the autonomous vehicle. The number of times the planning component causes the simulated autonomous vehicle to intersect with another object or to successfully navigate the scenario may be tracked over multiple iterations of a simulation.

A simulation for a particular configuration of a single scenario may be run multiple (e.g., thousands of) times for a single scenario in order to determine performance metrics, such as an intersection rate (e.g., percent of times the simulated autonomous vehicle intersected the geometry of another object over the simulations), a reliability rate (e.g., a percent of the simulations that the simulated autonomous vehicle navigated safely), etc. associated with a perception component. Note that a simulation scenario may specify various high-level general attributes of a simulation, such as a location, orientation, behavior, type, etc. of simulated objects in the simulated environment, characteristics of the environment, and a position and orientation of the autonomous vehicle in the simulated environment.

Whereas, a scenario configuration may indicate more detailed specifics of the simulation, such as weather conditions, object colors or general behaviors (e.g., erratic, not paying attention to other objects' behavior), or the like. For example, a first scenario may indicate that the autonomous vehicle is approaching, at 100 feet away, a four-way stop intersection with two vehicles stopped at the intersection and one pedestrian crossing one of the roadways. A scenario configuration may specify the color of the vehicles and/or clothing of the pedestrian, whether the pedestrian is paying attention, a size of the pedestrian and/or vehicles, or the like. According to the first example, testing a perception component may comprise executing the simulation multiple (up to hundreds or thousands of) times for each scenario and configuration in order to accurately estimate the perception component's reliability rate and/or failure rate using the perception error model sampling technique discussed above.

The techniques discussed herein may additionally include a technique according to a second example that reduces the number of simulations and therefore time and computational load required for determining performance metrics associated with a perception component. According to the second example, the techniques may comprise executing a simulation for a scenario configuration once using perfect perception and determining a point in the simulation at which the simulated autonomous vehicle was closest to another simulated object in the simulated environment. In some examples, the technique may comprise determining a state of the simulated object and/or the simulated autonomous vehicle at the point in the simulation at which the simulated object and the simulated autonomous vehicle were closest in distance. The technique may comprise determining, by the perception error model and based at least in part on the positions and/or states of the simulated object and/or the simulated autonomous vehicle, a likelihood that the simulated autonomous vehicle and the simulated object would overlap in space. Another way of stating this would be determining, using the perception error model, a likelihood that a perception error would occur of an extent greater than the distance between the simulated autonomous vehicle and the (perfectly perceived) simulated object.

This likelihood may be used to determine an accurate approximation of the failure rate of the perception component, i.e., how frequently an error of the perception component would result in an intersection of geometries, or, inversely, a reliability rate, i.e., how frequently the autonomous vehicle will operate in a collision-free manner. These rates may be aggregated over multiple scenarios and/or configurations to determine an overall reliability rate (or any other performance metrics) associated with a perception component. In some examples, this overall reliability rate may be calculated for multiple versions of a perception component and the perception component with a highest reliability rate and/or that meets a reliability rate threshold may be selected for and/or transmitted to an autonomous vehicle for implementation by the autonomous vehicle. In some examples, the reliability rate threshold may be a reliability rate that exceeds a reliability rate of an average human driver or a professional human driver.

In an additional or alternate example, the perception error model may be stored and executed on an autonomous vehicle as an auxiliary component to the perception component. In some examples, an error estimator comprising the perception component and/or a prediction model may receive as input an object detection and/or track generated by the perception component in association with an object that the perception component has determined based at least in part on sensor data gathered from an environment associated with a vehicle. The object detection may comprise one or more object detections, in time, associated with the same object and the track may indicate a historical position, heading, velocity, acceleration, confidence score(s), or the like associated with the object. The error estimator may output an indication of a likelihood that a point in space associated with the object detection is a false negative or a false positive. In other words, the error estimator may indicate that a particular point outside the region indicated as being associated with the object is associated with a particular likelihood of being occupied by the object even though it isn't included in the object detection (false negative) or that a point inside a region indicated as being associated with the object is associated with a likelihood of not being associated with the object even though it was included in the object detection (false positive).

In some examples, the error estimator may output the indication as a heat map (e.g., a mask associating a discrete portion of the environment with a likelihood of error), a set of contours, or the like. For example, a heat map may indicate the likelihood of a particular location in space associated with the object detection as being associated with a false negative or a false positive, or a contour may indicate a region or line surrounding the object detection associated with a same likelihood. In some examples, the output of the error estimator may be provided as input to the planning component. The planning component may determine a trajectory for controlling motion of the autonomous vehicle based at least in part on the output of the error model, such as by not selecting or generating any trajectories that intersect a contour associated with a predetermined likelihood.

The techniques discussed herein may be used to test and/or tune operation of an autonomous vehicle (e.g., a perception and/or prediction component of an autonomous vehicle), thereby increasing the safety of the autonomous vehicle and reducing environmental impact by and wear and tear on an autonomous vehicle by reducing the time spent operating by the autonomous vehicle.

Techniques described herein offer various computational efficiencies. The techniques require fewer computational resources and time to test, train, and/or tune one or more components of the autonomous vehicle (e.g., a perception component, a prediction component). For example, the techniques may reduce the amount of time and/or computing resources needed to accurately determine performance metrics associated with components of the autonomous vehicle, and thereby reduce the time it takes to make updates to the autonomous vehicle in examples where any updates are tested and vetted via simulation before making the updates to the autonomous vehicle in software and/or hardware. The techniques may also increase the number simulations that may be accomplished within a given time or given an allotted amount of computing resources (e.g., in an example where cloud computing resources are limited and/or paid for).

Furthermore, techniques described herein are directed to improvements in safety. That is, simulated environments resulting from generation techniques described herein can be used for testing, training, and validating systems onboard an autonomous vehicle to ensure such systems can operate autonomous vehicles safely when deployed in real environments. That is, simulated environments resulting from generation techniques described herein can be used for testing, training, and validating a planner system and/or a prediction system of an autonomous vehicle controller, which can be used by an autonomous vehicle to navigate the autonomous vehicle along a trajectory in a real environment. Thus, such training, testing, and validating enabled by techniques described herein can provide opportunities to ensure that autonomous vehicles can operate in real world environments safely. As such, techniques described herein improve safety and impact navigation.

Moreover, the use of the perception error model on-vehicle to output a heat map and/or contours of likelihood(s) of an error by the perception component and/or prediction component may further improve the safety and efficiency of the autonomous vehicle. For example, using the perception error model as part of an error estimation component that outputs likelihood(s) and/or extent(s) of a perception and/or prediction error may allow the autonomous vehicle to approach another object more closely than it would have without the perception error model, since the autonomous vehicle is more assured that the risk of a false positive is known and below a threshold.

Example Scenario

FIG. 1 illustrates an example scenario 100 including a vehicle 102. In some examples, the example scenario 100 may be a real-world scenario and/or the example scenario 100 may be a representation of a real-world scenario modeled as a simulated scenario. In examples where the example scenario 100 is a simulated scenario, the example scenario 100 may be determined based at least in part on input received at a user interface of a computing device (e.g., a user of the computing device may define the environment, objects therein, and/or characteristics thereof) and/or the example scenario 100 may be based at least in part on log data received from one or more autonomous vehicles. The log data may be based at least in part on sensor data received at an autonomous vehicle, perception data generated by a perception component, and/or instructions generated by a planning component. In some examples, the autonomous vehicle may store the log data and/or periodically transmit the log data to a remote computing device.

In some instances, the vehicle 102 may be an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. However, in other examples, the vehicle 102 may be a fully or partially autonomous vehicle having any other level or classification. It is contemplated that the techniques discussed herein may apply to more than robotic control, such as for autonomous vehicles. For example, the techniques discussed herein may be applied to mining, manufacturing, augmented reality, etc. Moreover, even though the vehicle 102 is depicted as a land vehicle, vehicle 102 may be a spacecraft, watercraft, and/or the like. In some examples, vehicle 102 may be represented in a simulation as a simulated vehicle, such as the vehicle representation 104 in simulated representation 106. For simplicity, the discussion herein does not distinguish between a simulated vehicle and a real-world vehicle. References to a "vehicle" may therefore reference a simulated and/or a real-world vehicle.

According to the techniques discussed herein and an example where scenario 100 is a real-world example, the vehicle 102 may receive sensor data from sensor(s) 108 of the vehicle 102. For example, the sensor(s) 108 may include a location sensor (e.g., a global positioning system (GPS) sensor), an inertia sensor (e.g., an accelerometer sensor, a gyroscope sensor, etc.), a magnetic field sensor (e.g., a compass), a position/velocity/acceleration sensor (e.g., a speedometer, a drive system sensor), a depth position sensor (e.g., a lidar sensor, a radar sensor, a sonar sensor, a time of flight (ToF) camera, a depth camera, and/or other depth-sensing sensor), an image sensor (e.g., a camera), an audio sensor (e.g., a microphone), and/or environmental sensor (e.g., a barometer, a hygrometer, etc.). In some examples, a simulated sensor may correspond with at least one of the sensor(s) 108 on the vehicle 102 and in a simulation, one or more of sensor(s) 108 may be simulated. In some examples, the position of a simulated sensor may correspond with a relative position of one of the sensor(s) 108 to the vehicle 102 and/or vehicle representation 104.

The sensor(s) 108 may generate sensor data, which may be received by computing device(s) 110 associated with the vehicle 102. However, in other examples, some or all of the sensor(s) 108 and/or computing device(s) 110 may be separate from and/or disposed remotely from the vehicle 102 and data capture, processing, commands, and/or controls may be communicated to/from the vehicle 102 by one or more remote computing devices via wired and/or wireless networks.

Computing device(s) 110 may comprise a memory 112 storing a perception component 114, a planning component 116, and/or a perception error component 118. Note that, in some examples, the computing device(s) 110 may additionally or alternatively store a localization component, which may comprise software and/or hardware system(s) for determining a pose (e.g., position and/or orientation) of the vehicle 102 relative to one or more coordinate frames (e.g., relative to the environment, relative to a roadway, relative to an inertial direction of movement associated with the autonomous vehicle). The localization component may output at least part of this data to the perception component 114, which may output at least some of the localization data and/or use the localization data as a reference for determining at least some of the perception data.

The perception component 114 may determine what is in the environment surrounding the vehicle 102 (or during a simulation what is in the simulated environment) and the planning component 116 may determine how to operate the vehicle 102 (or control the vehicle representation 104 in a simulation) according to information received from the localization component and/or the perception component 114. The localization component, the perception component 114, the planning component 116, and/or the perception error component 118 may include one or more machine-learned (ML) models and/or other computer-executable instructions.

In some examples, the localization component and/or the perception component 114 may receive sensor data from the sensor(s) 108 and/or simulated data from a simulation system. In some instances, the perception component 114 may determine data related to objects (or simulated objects) in the vicinity of the vehicle 102 (e.g., classifications associated with detected objects, instance segmentation(s), tracks), route data that specifies a destination of the vehicle, global map data that identifies characteristics of roadways (e.g., features detectable in different sensor modalities useful for localizing the autonomous vehicle), local map data that identifies characteristics detected in proximity to the vehicle (e.g., locations and/or dimensions of buildings, trees, fences, fire hydrants, stop signs, and any other feature detectable in various sensor modalities), etc. In some examples, the objects surrounding the vehicle 102 may be simulated objects of a simulated environment. The data produced by the perception component 114 may be collectively referred to as "perception data." Once the perception component 114 has generated perception data, the perception component 114 may provide the perception data to the planning component 116.

For example, during a real-world scenario, perception component 114 may detect object 120, a vehicle in the depicted example; object 122, another vehicle in the example; and/or characteristics of the roadway 124. During a simulation, perception component 114 may detect representation 126 and/or representation 128, where representation 126 may represent object 120 and representation 128 may represent object 122 in a simulation that reproduces the real-world scenario illustrated. Note that the depicted simulation representation 106 is a simplified simulation where different objects are represented as boxes and the depicted simulation representation 106 additionally includes additional simulated objects representing additional vehicles and pedestrians. It is understood that, instead of or in addition to a simplified simulation, the simulation may replicate real-world appearances.

When a perception component 114 detects an object, whether real or simulated, the perception component 114 may generate an object detection, which may comprise a data structure indicating one or more characteristics of the object. For example, the object detection may indicate a region of interest (ROI) associated with the object detection (e.g., a bounding box, mask, or other indication of a portion of sensor data associated with the object); a volume or area occupied by the object; a pose (e.g., position and/or orientation), velocity, acceleration, classification (e.g., vehicle, pedestrian, articulating vehicle, signage), etc. associated with the object, etc. The perception component 114 may associate an object detection with a track, which may indicate that the object has been previously detected and may comprise historical perception data and/or predicted perception data associated with the object. For example, the track may associate one or more object detections associated with a same object but different times.

According to the techniques discussed herein, the perception error component 118 may be trained based at least in part on a difference between prediction data generated during operation of the autonomous vehicle, which may be stored as part of log data, and perception data or ground truth data. Ground truth data may comprise manually labeled, automatically-labeled (e.g., via a machine-learned model pipeline trained for the task of ground truth generation), and/or semi-automatically labeled (e.g., automatically labeled and manually modified) data. In some examples, the perception error component 118 may be used to determine, based at least in part on receiving an object detection as input, contours 130, a heat map, and/or any other indication of a likelihood that output of the perception component 114 comprises an error. A contour may indicate a region or line associated with a same likelihood of error. There are three contours 130 depicted in FIG. 1, each of which may indicate a different likelihood per line. For example, the closest line to representation 128 may be associated with a 20% likelihood of an error, the next line may be associated with a 5% likelihood of an error, and the furthest line from representation 128 may be associated with a 0.001% likelihood of an error. In other words, the contour associated with 20% indicates that portion of the region surrounding the detection that is associated with a 20% likelihood of an error—a 20% likelihood that the space is associated with a false negative (i.e., an object actually exists at that location but was not detected). It is understood that more or less contours may be generated and/or for the same or different likelihoods.

In some examples, the perception component 114 may comprise a prediction component that determines predicted data associated with an object, such as a predicted future position, orientation, velocity, acceleration, or the like. This predicted data and/or historical data associated with an object may be amalgamated as a track in association with the object. In some examples, the prediction data may be additionally or alternatively based at least in part on map data or other data. In some examples, the prediction data may comprise a top-down segmentation of the environment, as described in more detail in U.S. patent application Ser. No. 15/963,833, which is incorporated in its entirety herein, and/or a top-down prediction associated with the environment, as described in more detail in U.S. patent application Ser. No. 16/779,576, which is incorporated in its entirety herein.

The planning component 116 may determine a trajectory 132 based at least in part on the perception data and/or localization data (e.g., where the vehicle 102 is in the environment relative to a map and/or features detected by the perception component 114). For example, the planning component 116 may determine a route for the vehicle 102 from a first location to a second location; generate, substantially simultaneously and based at least in part on the perception data, a plurality of potential trajectories for controlling motion of the vehicle 102 in accordance with a receding horizon technique (e.g., 1 micro-second, half a second) to control the vehicle to traverse the route (e.g., in order to avoid any of the detected objects); and select one of the potential trajectories as a trajectory 132 that the vehicle 102 may use to generate a drive control signal that may be transmitted to drive components of the vehicle 102 or, in a simulation, to control the vehicle representation 104 in the simulated environment.

FIG. 1 depicts an example of such a trajectory 132, represented as an arrow indicating a heading, velocity, and/or acceleration, although the trajectory itself may comprise instructions for a controller, which may, in turn, actuate a drive system of the vehicle 102. For example, the trajectory 132 may comprise instructions for controller(s) 134 of the autonomous vehicle 102 to actuate drive components of the vehicle 102 to effectuate a steering angle and/or steering rate, which may result in a vehicle position, vehicle velocity, and/or vehicle acceleration (or a simulated version thereof when the autonomous vehicle is being simulated). The trajectory 132 may comprise a target heading, target steering angle, target steering rate, target position, target velocity, and/or target acceleration for the controller(s) to track. However, in a simulation, the trajectory may be used by a simulation system to control a position, orientation, velocity, acceleration, etc. of the simulated autonomous vehicle.

The vehicle 102 may transmit at least part of the sensor data, perception data, and/or planning data as part of log data to a remote computing device (unillustrated in FIG. 1). The log data may be used to train the perception error component 118 and/or to create scenarios to run in a simulation.

Example System

Figure 2:
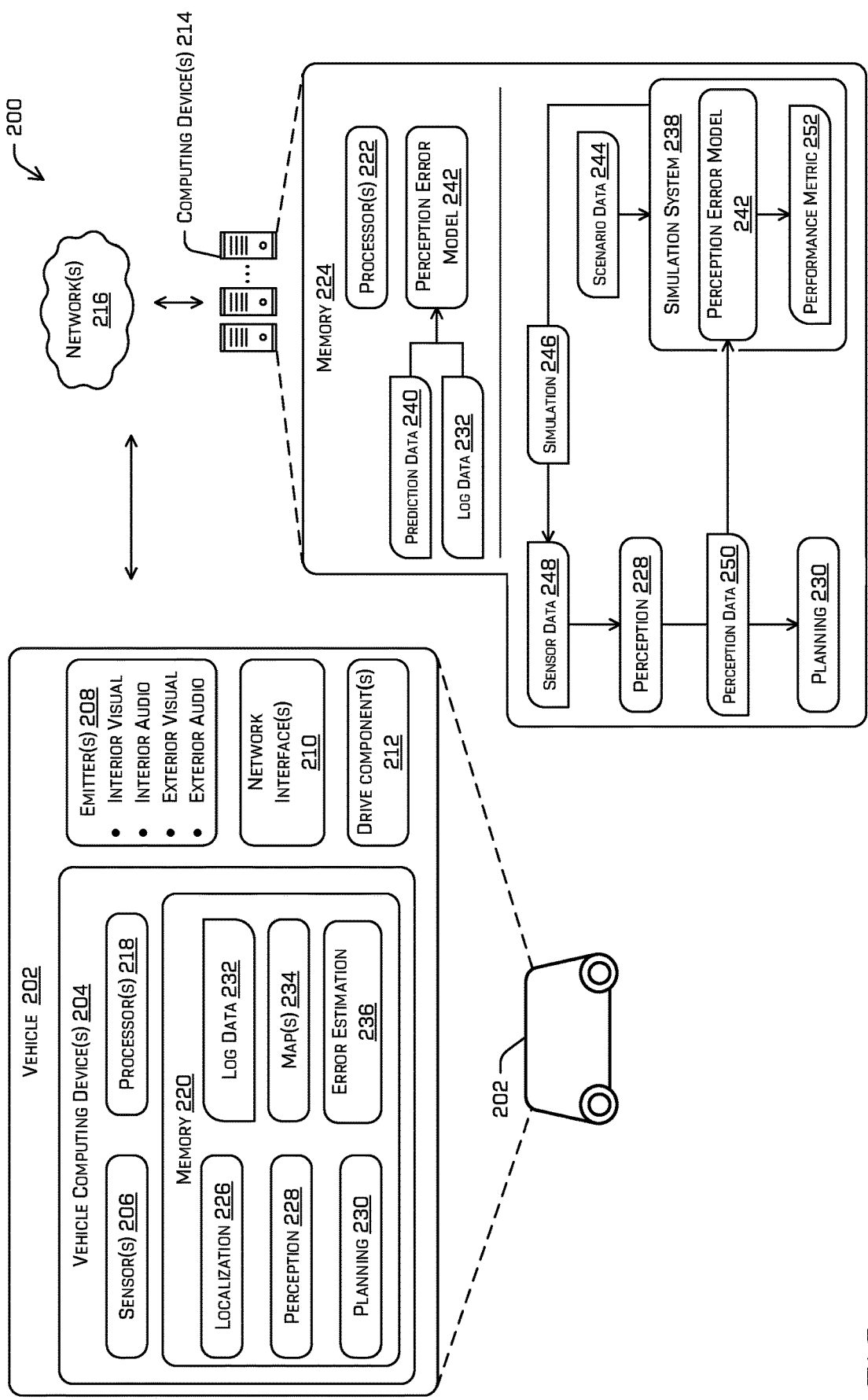
FIG. 2 illustrates an example architecture for executing simulations using an error estimation model and/or for controlling an autonomous vehicle using a perception error model.

FIG. 2 illustrates a block diagram of an example system 200 that implements the techniques discussed herein. In some instances, the example system 200 may include a vehicle 202, which may represent the vehicle 102 in FIG. 1. In some instances, the vehicle 202 may be an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. However, in other examples, the vehicle 202 may be a fully or partially autonomous vehicle having any other level or classification. Moreover, in some instances, the techniques described herein may be usable by non-autonomous vehicles as well.

The vehicle 202 may include a vehicle computing device(s) 204, sensor(s) 206, emitter(s) 208, network interface(s) 210, and/or drive component(s) 212. Vehicle computing device(s) 204 may represent computing device(s) 110 and sensor(s) 206 may represent sensor(s) 108. The system 200 may additionally or alternatively comprise computing device(s) 214.

In some instances, the sensor(s) 206 may represent sensor(s) 108 and may include lidar sensors, radar sensors, ultrasonic transducers, sonar sensors, location sensors (e.g., global positioning system (GPS), compass, etc.), inertial sensors (e.g., inertial measurement units (IMUs), accelerometers, magnetometers, gyroscopes, etc.), image sensors (e.g., red-green-blue (RGB), infrared (IR), intensity, depth, time of flight cameras, etc.), microphones, wheel encoders, environment sensors (e.g., thermometer, hygrometer, light sensors, pressure sensors, etc.), etc. The sensor(s) 206 may include multiple instances of each of these or other types of sensors. For instance, the radar sensors may include individual radar sensors located at the corners, front, back, sides, and/or top of the vehicle 202. As another example, the cameras may include multiple cameras disposed at various locations about the exterior and/or interior of the vehicle 202. The sensor(s) 206 may provide input to the vehicle computing device(s) 204 and/or to computing device(s) 214. In some examples, the simulated sensors discussed herein may correspond to a specific type of sensor and/or any of the sensors. The position associated with a simulated sensor, as discussed herein, may correspond with a position and/or point of origination of a field of view of a sensor (e.g., a focal point) relative the vehicle 202 and/or a direction of motion of the vehicle 202.

The vehicle 202 may also include emitter(s) 208 for emitting light and/or sound, as described above. The emitter(s) 208 in this example may include interior audio and visual emitter(s) to communicate with passengers of the vehicle 202. By way of example and not limitation, interior emitter(s) may include speakers, lights, signs, display screens, touch screens, haptic emitter(s) (e.g., vibration and/or force feedback), mechanical actuators (e.g., seatbelt tensioners, seat positioners, headrest positioners, etc.), and the like. The emitter(s) 208 in this example may also include exterior emitter(s). By way of example and not limitation, the exterior emitter(s) in this example include lights to signal a direction of travel or other indicator of vehicle action (e.g., indicator lights, signs, light arrays, etc.), and one or more audio emitter(s) (e.g., speakers, speaker arrays, horns, etc.) to audibly communicate with pedestrians or other nearby vehicles, one or more of which comprising acoustic beam steering technology.

The vehicle 202 may also include network interface(s) 210 that enable communication between the vehicle 202 and one or more other local or remote computing device(s). For instance, the network interface(s) 210 may facilitate communication with other local computing device(s) on the vehicle 202 and/or the drive component(s) 212. Also, the network interface (s) 210 may additionally or alternatively allow the vehicle to communicate with other nearby computing device(s) (e.g., other nearby vehicles, traffic signals, etc.). The network interface(s) 210 may additionally or alternatively enable the vehicle 202 to communicate with computing device(s) 214. In some examples, computing device(s) 214 may comprise one or more nodes of a distributed computing system (e.g., a cloud computing architecture).

The network interface(s) 210 may include physical and/or logical interfaces for connecting the vehicle computing device(s) 204 to another computing device or a network, such as network(s) 216. For example, the network interface(s) 210 may enable Wi-Fi-based communication such as via frequencies defined by the IEEE 200.11 standards, short range wireless frequencies such as Bluetooth®, cellular communication (e.g., 2G, 3G, 4G, 4G LTE, 5G, etc.) or any suitable wired or wireless communications protocol that enables the respective computing device to interface with the other computing device(s). In some instances, the vehicle computing device(s) 204 and/or the sensor(s) 206 may send sensor data, via the network(s) 216, to the computing device(s) 214 at a particular frequency, after a lapse of a predetermined period of time, in near real-time, etc.

In some instances, the vehicle 202 may include one or more drive components 212. In some instances, the vehicle 202 may have a single drive component 212. In some instances, the drive component(s) 212 may include one or more sensors to detect conditions of the drive component(s) 212 and/or the surroundings of the vehicle 202. By way of example and not limitation, the sensor(s) of the drive component(s) 212 may include one or more wheel encoders (e.g., rotary encoders) to sense rotation of the wheels of the drive components, inertial sensors (e.g., inertial measurement units, accelerometers, gyroscopes, magnetometers, etc.) to measure orientation and acceleration of the drive component, cameras or other image sensors, ultrasonic sensors to acoustically detect objects in the surroundings of the drive component, lidar sensors, radar sensors, etc. Some sensors, such as the wheel encoders may be unique to the drive component(s) 212. In some cases, the sensor(s) on the drive component(s) 212 may overlap or supplement corresponding systems of the vehicle 202 (e.g., sensor(s) 206).

The drive component(s) 212 may include many of the vehicle systems, including a high voltage battery, a motor to propel the vehicle, an inverter to convert direct current from the battery into alternating current for use by other vehicle systems, a steering system including a steering motor and steering rack (which may be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive component(s) 212 may include a drive component controller which may receive and preprocess data from the sensor(s) and to control operation of the various vehicle systems. In some instances, the drive component controller may include one or more processors and memory communicatively coupled with the one or more processors. The memory may store one or more components to perform various functionalities of the drive component(s) 212. Furthermore, the drive component(s) 212 may also include one or more communication connection(s) that enable communication by the respective drive component with one or more other local or remote computing device(s).

The vehicle computing device(s) 204 may include processor(s) 218 and memory 220 communicatively coupled with the one or more processors 218. Memory 220 may represent memory 112. Computing device(s) 214 may also include processor(s) 222, and/or memory 224. The processor(s) 218 and/or 222 may be any suitable processor capable of executing instructions to process data and perform operations as described herein. By way of example and not limitation, the processor(s) 218 and/or 222 may comprise one or more central processing units (CPUs), graphics processing units (GPUs), integrated circuits (e.g., application-specific integrated circuits (ASICs)), gate arrays (e.g., field-programmable gate arrays (FPGAs)), and/or any other device or portion of a device that processes electronic data to transform that electronic data into other electronic data that may be stored in registers and/or memory.

Memory 220 and/or 224 may be examples of non-transitory computer-readable media. The memory 220 and/or 224 may store an operating system and one or more software applications, instructions, programs, and/or data to implement the methods described herein and the functions attributed to the various systems. In various implementations, the memory may be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein may include many other logical, programmatic, and physical components, of which those shown in the accompanying figures are merely examples that are related to the discussion herein.

In some instances, the memory 220 and/or memory 224 may store a localization component 226, perception component 228, planning component 230, log data 232, map(s) 234, and/or error estimation component 236—zero or more portions of any of which may be hardware, such as GPU(s), CPU(s), and/or other processing units. Perception component 228 may represent perception component 114, and planning component 230 may represent planning component 116. Memory 224 may additionally or alternatively store simulation system 238.

In at least one example, the localization component 226 may include hardware and/or software to receive data from the sensor(s) 206 to determine a position, velocity, and/or orientation of the vehicle 202 (e.g., one or more of an x-, y-, z-position, roll, pitch, or yaw). For example, the localization component 226 may include and/or request/receive map(s) 234 of an environment and can continuously determine a location, velocity, and/or orientation of the autonomous vehicle within the map(s) 234. In some instances, the localization component 226 may utilize SLAM (simultaneous localization and mapping), CLAMS (calibration, localization and mapping, simultaneously), relative SLAM, bundle adjustment, non-linear least squares optimization, and/or the like to receive image data, lidar data, radar data, IMU data, GPS data, wheel encoder data, and the like to accurately determine a location, pose, and/or velocity of the autonomous vehicle. In some instances, the localization component 226 may provide data to various components of the vehicle 202 to determine an initial position of an autonomous vehicle for generating a trajectory and/or for generating map data, as discussed herein. In some examples, localization component 226 may provide, to the perception component 228, a location and/or orientation of the vehicle 202 relative to the environment and/or sensor data associated therewith.

In some instances, perception component 228 may comprise hardware and/or software. The perception component 228 may detect object(s) in in an environment surrounding the vehicle 202 (e.g., identify that an object exists), classify the object(s) (e.g., determine an object type associated with a detected object), segment sensor data and/or other representations of the environment (e.g., identify a portion of the sensor data and/or representation of the environment as being associated with a detected object and/or an object type), determine characteristics associated with an object (e.g., a track identifying current, predicted, and/or previous position, heading, velocity, and/or acceleration associated with an object), and/or the like. Data determined by the perception component 228 is referred to as perception data.

The planning component 230 may receive a location and/or orientation of the vehicle 202 from the localization component 226 and/or perception data from the perception component 228 and may determine instructions for controlling operation of the vehicle 202 based at least in part on any of this data. In some examples, determining the instructions may comprise determining the instructions based at least in part on a format associated with a system with which the instructions are associated (e.g., first instructions for controlling motion of the autonomous vehicle may be formatted in a first format of messages and/or signals (e.g., analog, digital, pneumatic, kinematic) that the drive component(s) 212 may parse/cause to be carried out, second instructions for the emitter(s) 208 may be formatted according to a second format associated therewith). In some examples, where the planning component 230 may comprise hardware/software-in-a-loop in a simulation (e.g., for testing and/or training the planning component 230), the planning component 230 may generate instructions which may be used to control a simulated vehicle. The planning component 230 may be part of the simulation system 238 in some examples.

The log data 232 may comprise sensor data, perception data, and/or scenario labels collected/determined by the vehicle 202 (e.g., by the perception component 228), as well as any other message generated and or sent by the vehicle 202 during operation including, but not limited to, control messages, error messages, etc. In some examples, the vehicle 202 may transmit the log data 232 to the computing device(s) 214. The computing device(s) 214 may identify one or more scenarios based at least in part on the log data, which may also comprise defining a scenario. For example, the computing device(s) 214 may determine an environmental layout, a number, type, and a configuration of object(s) in the environment and/or associate this definition with one or more portions of log data associated with that scenario. In some examples, the log data 232 may comprise (historical) prediction data 240 that was generated on the vehicle 102 during operation of the vehicle. In an additional or alternate example, the prediction data 240 may be part of perception data generated during a simulation. Note that, although simulation scenarios may be determined from log data, they may also be defined based at least in part on user input or the like.

In some examples, the error estimation model 236 may comprise the perception error model 342, a machine-learned (ML) model, and/or a prediction model. The error estimation model 236 may be configured to receive an object detection and/or track from the perception component 228 as input and to output a heat map, contour(s), and/or the like indicating a likelihood that a current object detection comprises an error.

In some examples, the computing device(s) 214 may determine the perception error model 242 based at least in part on the log data 232, which may comprise perception data and perception data may, in turn, include prediction data 240, according to the techniques discussed in further detail in U.S. patent application Ser. No. 16/708,019, filed Dec. 9, 2019, the entirety of which is incorporated herein by reference. In some examples, training the perception error model 242 may comprise receiving ground truth data associated with prediction data 240 extracted from log data (e.g., the log data may be generated from simulated or real-world operation of the autonomous vehicle) and determining a difference between the prediction data 240 and the ground truth data. For example, the prediction data 240 may be a prediction associated with time n+1 and the ground truth data may include the perception system output at time n+1 and/or label data generated by manual, semi-automatic, or automatic ground truth labelling. In some examples, perception error model 242 may comprise an ML model (e.g., use a Bernoulli distribution as a kernel function, hybrid decision tree—Bernoulli model, deep neural network, Markov deep neural network model, Markov mixture density network) and/or statistical distributions of a likelihood of an error controlled by outputs of the ML model (e.g., a mixture density network (MDN), Bernoulli distribution). The perception error model 242 may be trained to output a likelihood (e.g., posterior probability) of an error and/or an extent of an error (e.g., an offset distance from an object detection indicating an estimated actual location of the dimensions of an object).

In some examples, the perception error model may be trained differently for true positive perception errors and for detecting false negative errors. In at least one non-limiting example for training a true positive perception error model, the baseline model may be built on the assumption that each component of the true positive error vector is conditionally independent. In such an example, the kernel function of the model may comprise Gaussian and/or any other generalized normalized distribution that represents the probability density function for each dimension. In some examples, multiple kernel functions may be used to fit the errors, such as by using a linear combination of kernels where the kernels comprise a Gaussian or other normalized distribution. The model may be trained on clusters of similar scenario and/or log data, which may be clustered using a k-means clustering algorithm on scenario labels associated with simulation and/or log data. In at least one non-limiting example, the perception error model may be a mixture density network (MDN) model trained via a feedforward neural network run on the input scenario-specific ground truth vector (e.g., determined by the k-means clustering) and the outputs of the neural network may be used as the parameters of the MDN that defines a probability density function of the error vector. The history of errors might be correlated to the error corresponding to a current timestep. In at least some examples, the perception error model may be further extended into a Markov MDN, where the feedforward neural network is run on an extended input vector that includes a ground truth vector and the previous timestep's error vector and the outputs of the neural network may be used as the parameters of mixture model that defines the probability density function of the error vector of a current timestep associated with a perception component output.

In at least one non-limiting example for training a perception error model to determine the existence, extent, and/or likelihood of false negative errors, the baseline model may comprise a Bernoulli distribution for the kernel function that represents the probability density function for false negative error. Again, scenario-related data may be clustered using k-means clustering of the log data and/or simulation data and a Bernoulli distribution may be determined based at least in part on an error between ground truth data and the corresponding simulation and/or log data for each cluster. In some examples, a decision tree model may be applied to the clusters to further segregate disparate scenarios and error data may be determined for each leaf based at least in part on ground truth data and simulation data or log data associated with the leaf. The perception error model itself may comprise a deep neural network that is trained based at least in part on receiving a scenario ground truth vector and outputs a parameter of a Bernoulli distribution that defines the probability density of a false negative error, as discussed in U.S. Ser. No. 16/708,019, filed Dec. 9, 2019, and U.S. patent application Ser. No. 16/862,693, filed Apr. 30, 2020, both of which are incorporated in their entirety herein. In some examples, the history of errors may be correlated to the error corresponding to the current timestep. Additionally or alternatively, the neural network may be extended as a Markov deep neural network, where the feedforward neural network is run on an extended input vector that includes both specific ground truth vector and the previous timestamp error vector and the output of neural network is used as the parameter of Bernoulli Distribution that defines the probability density function of false negative error of a current timestamp associated with a perception component output.

In some examples, the computing device(s) 214 may transmit the perception error model 242 associated with a particular version of perception component 228 to the vehicle computing device 204 upon selection of the perception component 228 for implementation at the vehicle 202. Implementing the perception component 228 at the vehicle 202 may comprise transmitting a software portion of the perception component 228 to the vehicle to update the perception component; however, in some examples, the perception component 228 may comprise hardware that would need to be physically modified if changes were made thereto.

The simulation system 238 may operate on the vehicle 202 and/or on the computing device(s) 214 (although FIG. 2 depicts the simulation system 238 as operating on the computing device(s) 214. The simulation system 238 may run parallel to the perception component 228 and/or the perception component 228 may be part of the simulation system 238 and/or provide perception data to the simulation system 238.

The simulation system 238 may determine a simulation of the environment and/or the vehicle 202. For example, the simulation may comprise a representation of a position, orientation, movement, and/or quality of portions of the environment and/or the vehicle 202. The environment may comprise an agent, such as another vehicle, a pedestrian, vegetation, a building, signage, and/or the like. Simulation may be used to test operation of various components of the vehicle 202. In some examples, simulation may be used to test the perception component 228 and/or the planning component 230 of the autonomous vehicle based at least in part on providing data from the simulation to the perception component 228 and/or the planning component 230.

The simulation system 238 may receive scenario data 244 and/or log data 232. The simulation system 332 may receive scenario data 244 and/or log data 232 to determine the simulation 246, which may be a two or three-dimensional representation of the scenario. For example, the three-dimensional representation may comprise position, orientation, geometric data (e.g., a polygon representation, a digital wire mesh representation) and/or movement data associated with one or more objects of the environment and/or may include material, lighting, and/or lighting data, although in other examples this data may be left out. In some examples, the scenario data 244 may be procedurally generated as part of a combinatorial iteration through scenarios, received responsive to interaction with a user interface of the computing device(s) 214 (e.g., responsive to user input), and/or the like, although in at least one example, the scenario data 244 may be at least partially defined by a scenario associated with the log data. In some examples, the scenario data 244 may modify characteristics of a scenario that is generated based on log data 232.

The scenario data 244 may comprise a two-dimensional representation of an environment associated with a scenario, objects contained therein, and characteristics associated therewith, all of which may be part of a scenario associated with the log data. For example, the scenario data 244 may identify a position of an object, an area occupied by the object, a velocity and/or acceleration associated with the object, whether the object is static or dynamic, an object type associated with the object (e.g., a classification such as "pedestrian," "bicyclist," "vehicle," "oversized vehicle," "traffic light," "traffic signage," "building," "roadway," "crosswalk, "sidewalk"), and/or other kinematic qualities associated with the object and/or the object type (e.g., a friction coefficient, an elasticity, a malleability). As regards the environment itself, the scenario data may identify a topology of the environment, weather conditions associated with the environment, a lighting state (e.g., sunny, cloudy, night), a location of light sources, and/or the like. In some examples, topology, fixed object (e.g., buildings, trees, signage) locations and dimensions, and/or the like associated with the scenario data 244 may be generated based at least in part on map(s) 234. In some examples, the scenario data 244 may be used to instantiate a three-dimensional representation of the object and/or the simulated environment may be instantiated based at least in part on map data (e.g., which may define a topology of the environment; the location and/or dimensions of fixtures such as signage, plants, and/or buildings) and/or the scenario data. In some examples, an perception error model 242 may be associated with a scenario or vice versa.

In some examples, a simulated sensor may determine simulated sensor data 248 based at least in part on the simulation 246. For example, U.S. patent application Ser. No. 16/581,632, filed Sep. 24, 2019 and incorporated herein, discusses this in more detail. In an additional or alternate example, the simulation 246 may itself comprise simulated sensor data.

The perception component 228 (e.g., a copy thereof, which may comprise software and/or hardware, which may include hardware-in-the loop simulation) may receive the simulated sensor data 248 generated based on the simulation 246 and may output perception data 250, which may comprise a predicted maneuver and/or a predicted path of a simulated object. The perception component 228 may provide the perception data 250 to the planning component 230 and/or to the perception error model 242, which may be part of the simulation system 238 or called by the simulation system 238 when an object of a type associated with the perception error model 242 is instantiated based at least in part on the scenario data 244.

The perception error model 242 may output performance metrics according to the techniques discussed herein. For the sake of example and without limitation, the performance metrics may comprise any performance metric(s) 252, which may comprise a reliability rate, failure rate (e.g., number or percent of times an intersection would have occurred), a time it takes to complete a mission (e.g., time it takes between picking up a passenger and reaching a destination), a number of times and/or an extent to which the brakes were activated, whether the brakes were maximally activated and/or a number of times the brakes were maximally activated, a number of times and/or an extent to which the vehicle swerved or stopped (e.g., which may be based at least in part on lateral and/or longitudinal velocity and/or acceleration), and/or any other metric associated with the simulation. In some examples, the performance metric 252 may be determined per version of perception component 228 in examples where multiple perception component types or versions are being tested (e.g., testing a new/updated perception component versus a former perception component) and used to select and/or confirm a perception component in examples where the performance metric satisfies a criteria (e.g., a failure rate that is below a failure rate threshold, a reliability rate above a reliability rate threshold).

In some examples, the simulation system 238 may additionally or alternatively store a ruleset and may determine whether the perception component 228 passed or failed a scenario based at least in part on the ruleset. The ruleset may be associated with the scenario data 244. In some examples, the simulation system 238 may record a version of the perception component 228 in association with a scenario identifier and/or an indication of whether the perception component 228 passed or failed. In an additional or alternate example, the simulation system 238 may determine a non-binary indication associated with performance of the perception component 228 (e.g., a score in addition to or instead of a pass/fail indication). The non-binary indication may be based at least in part on a set of weights associated with the ruleset. In at least one example, the ruleset may specify a maximum number of overlaps/intersections of any portion of two objects' geometries per n iterations of a scenario, where n is a positive integer. In some examples, the ruleset may be part of or replaced by an event detection system (U.S. patent application Ser. No. 16/682,971, filed Nov. 13, 2019, the entirety of which is incorporated herein) and/or a collision monitoring system (U.S. patent application Ser. No. 16/703,625, filed Dec. 4, 2019).

The memory 220 and/or 224 may additionally or alternatively store a mapping system, a planning system, a ride management system, etc. Although perception component 228 and/or planning component 230 are illustrated as being stored in memory 220 and/or 224, perception component 228 and/or planning component 230 may include processor-executable instructions, machine-learned model(s) (e.g., a neural network), and/or hardware.

As described herein, the localization component 226, the perception component 228, the planning component 230, the perception error model 242, the simulation system 238, and/or other components of the system 200 may comprise one or more ML models. For example, the localization component 226, the perception component 228, the planning component 230, error estimation component 236, the simulation system 238, and/or the perception error model 242 may each comprise different ML model pipelines. In some examples, an ML model may comprise a neural network. An exemplary neural network is a biologically inspired algorithm which passes input data through a series of connected layers to produce an output. Each layer in a neural network can also comprise another neural network, or can comprise any number of layers (whether convolutional or not). As can be understood in the context of this disclosure, a neural network can utilize machine-learning, which can refer to a broad class of such algorithms in which an output is generated based on learned parameters. Of course, any of the models comprise multiple models each receiving differing input and providing an associated output and/or one or more models having multiple heads. In at least some examples in which multiple output heads are used, the model may improve output associated with one modality based on parameters of a shared portion of the model learn from various other sensor modalities.

Although discussed in the context of neural networks, any type of machine-learning can be used consistent with this disclosure. For example, machine-learning algorithms can include, but are not limited to, regression algorithms (e.g., ordinary least squares regression (OLSR), linear regression, logistic regression, stepwise regression, multivariate adaptive regression splines (MARS), locally estimated scatterplot smoothing (LOESS)), instance-based algorithms (e.g., ridge regression, least absolute shrinkage and selection operator (LASSO), elastic net, least-angle regression (LARS)), decisions tree algorithms (e.g., classification and regression tree (CART), iterative dichotomiser 3 (D3), Chi-squared automatic interaction detection (CHAD), decision stump, conditional decision trees), Bayesian algorithms (e.g., naïve Bayes, Gaussian naïve Bayes, multinomial naïve Bayes, average one-dependence estimators (AODE), Bayesian belief network (BNN), Bayesian networks), clustering algorithms (e.g., k-means, k-medians, expectation maximization (EM), hierarchical clustering), association rule learning algorithms (e.g., perceptron, back-propagation, hopfield network, Radial Basis Function Network (RBFN)), deep learning algorithms (e.g., Deep Boltzmann Machine (DBM), Deep Belief Networks (DBN), Convolutional Neural Network (CNN), Stacked Auto-Encoders), Dimensionality Reduction Algorithms (e.g., Principal Component Analysis (PCA), Principal Component Regression (PCR), Partial Least Squares Regression (PLSR), Sammon Mapping, Multidimensional Scaling (MDS), Projection Pursuit, Linear Discriminant Analysis (LDA), Mixture Discriminant Analysis (MDA), Quadratic Discriminant Analysis (QDA), Flexible Discriminant Analysis (FDA)), Ensemble Algorithms (e.g., Boosting, Bootstrapped Aggregation (Bagging), AdaBoost, Stacked Generalization (blending), Gradient Boosting Machines (GBM), Gradient Boosted Regression Trees (GBRT), Random Forest), SVM (support vector machine), supervised learning, unsupervised learning, semi-supervised learning, etc. Additional examples of architectures include neural networks such as ResNet-50, ResNet-101, VGG, DenseNet, PointNet, and the like. In some examples, the ML model discussed herein may comprise PointPillars, SECOND, top-down feature layers (e.g., see U.S. patent application Ser. No. 15/963,833, which is incorporated in its entirety herein), and/or VoxelNet. Architecture latency optimizations may include MobilenetV2, Shufflenet, Channelnet, Peleenet, and/or the like. The ML model may comprise a residual block such as Pixor, in some examples.

Memory 220 may additionally or alternatively store one or more system controller(s), which may be configured to generate instructions for controlling steering, propulsion, braking, safety, emitters, communication, and other systems of the vehicle 202. These system controller(s) may communicate with and/or control corresponding systems of the drive component(s) 212 and/or other components of the vehicle 202. For example, the planning component 230 may generate instructions based at least in part on perception data generated by the perception component 228 and/or simulated perception data and transmit the instructions to the system controller(s), which may control operation of the vehicle 202 based at least in part on the instructions.

It should be noted that while FIG. 2 is illustrated as a distributed system, in alternative examples, components of the vehicle 202 may be associated with the computing device(s) 214 and/or components of the computing device(s) 214 may be associated with the vehicle 202. That is, the vehicle 202 may perform one or more of the functions associated with the computing device(s) 214, and vice versa.

Example Simulation Process

Figure 3:
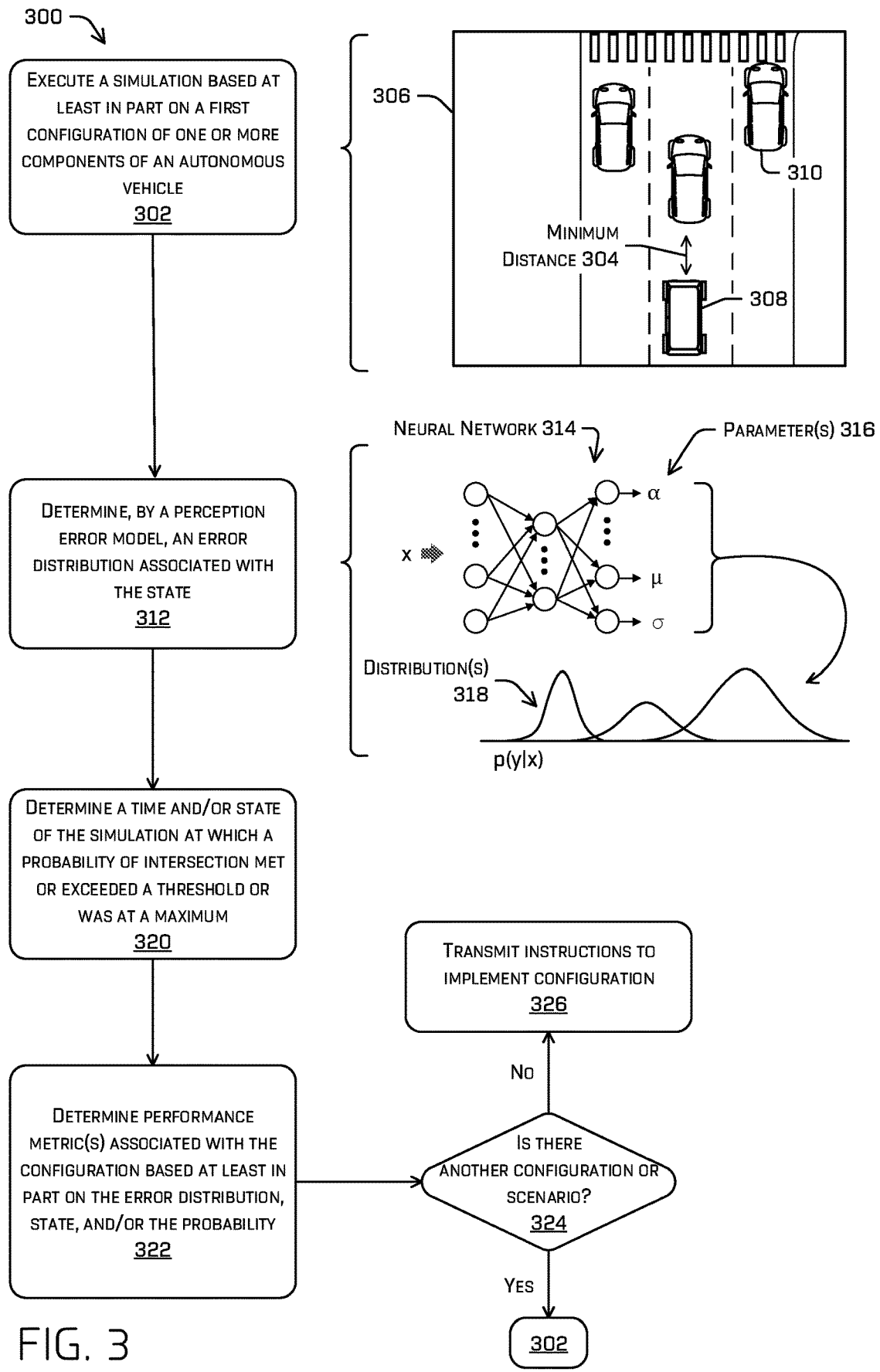
FIG. 3 illustrates a pictorial flow diagram of an example process for using a perception error model to reduce computational loads for simulations.

FIG. 3 illustrates a pictorial flow diagram of an example process 300 for using a perception error model to determine a fast estimate of performance metrics associated with a perception component. The techniques discussed herein may be used to select a perception component according to a ruleset (e.g., an optimization and/or thresholding of one or more parameters, such as safety, efficacy, energy usage) and/or testing a perception component before updating a vehicle with the perception component. It is understood that the examples discussed herein may be extended to a prediction component, which may be part of or distinct from a perception component. In some examples, a prediction error model may be received that identifies the perception component with which it is associated. A prediction error model may be determined based at least in part on the techniques discussed in U.S. patent application Ser. No. 16/708,019, filed Dec. 9, 2019, the entirety of which is incorporated herein by reference. Example process may additionally or alternatively be used to alter a configuration of one or more components of the autonomous vehicle to improve overall performance metrics. Note that the discussion below deals with a single perception component and perception error model, although it is understood that the techniques may be used to test multiple perception components and select one of the multiple perception components for implementation based at least in part on satisfaction of a ruleset, which may specify one or more thresholds to be satisfied and/or comprise an optimization algorithm.

Moreover, example process 300 may be repeated for different simulation scenarios without needing to repeat a same scenario. For example, example process 300 may comprise executing a simulation for a specific scenario once, without repeating the simulation for that same scenario with different permutations of vehicle colors, pedestrian clothing colors, weather states, lighting states, etc. Example process 300 therefore allows a simpler, less computationally expensive simulation to be used without sacrificing the accuracy of the performance metric estimate(s). In some instances, the vehicle computing device(s) 204 and/or the computing device(s) 214 may each or individually accomplish all or part of example process 300.

At operation 302, example process 300 may comprise executing a simulation based at least in part on a first configuration of one or more components of an autonomous vehicle, according to any of the techniques discussed herein. For example, the configuration may comprise one or more parameters associated with one or more different components of the autonomous vehicle. To give a simple example, the planning component may store a ruleset that is part of the configuration, and that ruleset may specify a minimum distance 304 that must be maintained from any other objects. Other examples of these sorts of parameters may include target maximum velocity and/or acceleration, maximum jerk, heuristics, any of a number of thresholds (e.g., threshold confidence level for implementing a trajectory, threshold confidence level for indicating that an object might exist in an area of the environment occluded to the sensors, a threshold amount of time without being able to perform an action necessary to complete a route before making a contingent or emergency action).

FIG. 3 depicts a top-down view 306 of a scenario for simulation that may be specified by scenario data 244. The top-down view 306 of the scenario includes a representation 308 of the vehicle 202 and representations of three other vehicles on a three-lane roadway. The scenario may specify that the vehicle 202 is to perform a right lane change and that the representation 310 of one of the vehicles will make a right-hand turn as the scenario progresses.

According to the techniques discussed herein, the simulation may be executed for a first scenario and a first configuration of the vehicle once. This may drastically reduce the amount of time needed to simulate a scenario over former techniques that would require re-simulating the scenario multiple times (e.g., tens, hundreds, or even thousands of times). As discussed at operation 324, simulating the first scenario may be repeated but using a second configuration of the vehicle. Other techniques would require executing the first scenario using the first configuration hundreds, thousands, or hundreds of thousands of times, then executing the first scenario using the second configuration additional hundreds, thousands, or hundreds of thousands of times.

The simulation, according to operation 302, may comprise providing the ground truth object detections as input to the planning component instead of the normal output of the perception component. The perception component may continue to run for testing or it may be turned off/taken out of the pipeline. Regardless, according to the techniques discussed herein, the output of the perception component is not provided at the planning component and object detections associated with the simulation is provided to the planning component instead. This is called "perfect" perception herein.

Figure 4A:
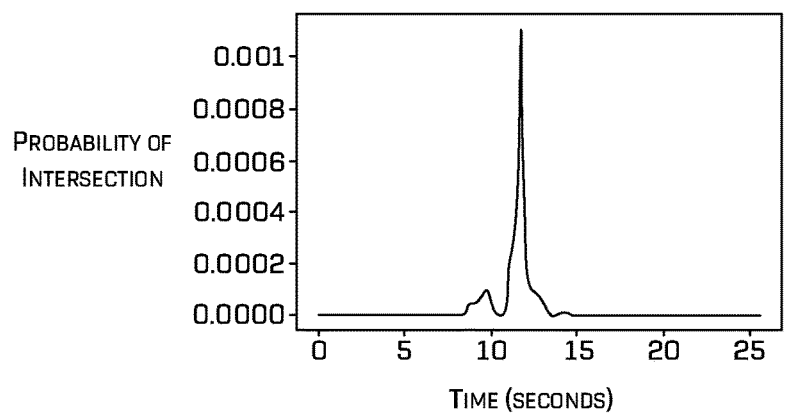
FIGS. 4A & 4B illustrate graphs of a probability of intersection/overlap determined for two different configurations of a vehicle and a same simulation scenario.
Figure 4B:
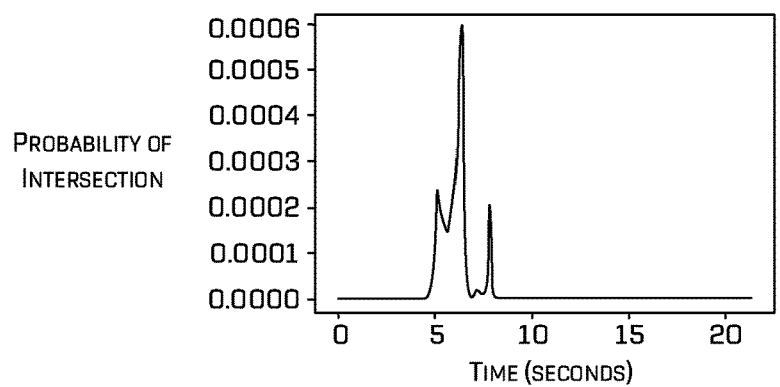

At operation 312, example process 300 may comprise determining, by a perception error model and based at least in part on the simulation, an error distribution an error distribution associated with a time and/or state of the simulation, according to any of the techniques discussed herein. In at least one example, the perception error model may comprise a neural network 314 trained to receive an object detection (contained in the perception data), x, as input and to output parameter(s) 316 of a mixture density network (MDN) or other model for determining probability distribution(s). The parameter(s) 316 may be used to determine a mixture model, which may comprise one or more probability distributions 318. The distribution(s) 318 may be used to determine a probability of intersection of the simulated autonomous vehicle with a geometry associated with the object. In some examples, the probability may a likelihood, such as a posterior probability. This may be repeated for one or more (up to all) of the objects in the scene and an overall probability may be determined. For example, the overall probability of intersection may be a maximum of the probabilities determined for each of the objects, i.e., the maximum probability at each time step, regardless of which object detection generated the probability. FIGS. 4A and 4B depict this probability over time for two different scenarios.

At operation 320, example process 300 may comprise determining a time and/or state at which the probability meets or exceeds a threshold probability or at which the probability at its maximum for the scenario, according to any of the techniques discussed herein. For example, the probability used at operation 320 may be an overall probability of intersection with any simulated object. Operation 320 may comprise determine a time in the simulation or a state of the simulation and/or autonomous vehicle at which the probability is at its maximum. Additionally or alternatively operation 320 may save the value of this (maximum) probability.

In some examples, the state of the simulation determined at operation 320 may comprise any of the information about the simulation at, before, or after that time step, including a position, orientation, region occupied by/extents of, velocity, acceleration, and/or the like associated with the simulated object and/or the simulated autonomous vehicle—any data necessary for determining the performance metric(s). The state may be retrieved from the simulation log data. In at least one example, the state may comprise an object detection in the same data structure format as would be output by the perception component.

At operation 322, example process 300 may comprise determining performance metric(s) associated with the configuration of the component(s) based at least in part on the error distribution, state, and/or probability, according to any of the techniques discussed herein. In some examples, operation 322 may comprise determining a portion of an error distribution associated with a region in the simulation environment that would have resulted in an intersection. For example, operation 322 may comprise determining a region of the environment associated with a non-zero probability as indicated by the perception error model and where a corner or edge of the simulated vehicle overlaps part of a simulated object and determining the probability associated with all of the portions that may overlap. Intuitively, the further the simulated vehicle was from the closest simulated object, the greater the perception error would have had to be for the simulated object and the simulated vehicle to overlap/intersect.

The performance metric(s) may include a reliability rate, a failure rate, a time it takes to complete a mission (e.g., time it takes between picking up a passenger and reaching a destination), a number of times and/or an extent to which the brakes were activated, whether the brakes were maximally activated and/or a number of times the brakes were maximally activated, a number of times and/or an extent to which the vehicle swerved or stopped (e.g., which may be based at least in part on lateral and/or longitudinal velocity and/or acceleration), and/or any other metric associated with the simulation. For example, determining a failure rate may comprise evaluating the following equation:

$$\text{failure rate} = \int p(\vec{e}/\vec{x}_{GT}) \quad (1)$$

subject to $\vec{e} \in$ region identified at operation 312 and where p is the probability distribution output by the perception error model, $\vec{e}$ is the perception error vector, and $\vec{x}_{GT}$ is a vector representing the ground truth location of the closest simulated object. Determining the reliability rate may comprise subtracting the failure rate from 1.

At operation 324, example process 300 may comprise determining whether there are any other configurations of the one or more components of the autonomous vehicle to be tested or any additional scenarios that haven't been simulated for the current configuration, according to any of the techniques discussed herein. If there is an additional configuration that hasn't been tested, example process 300 may return to operation 302 with the n-th configuration, where n is a positive integer. Returning to operation 302 may comprise procedurally generating another configuration according to a Monte Carlo or any other appropriate simulation or iteration method; tuning the configuration according to an optimization algorithm, backpropagation, or another feedback method; and/or retrieving another configuration from memory. If the next configuration is associated with a different version of the perception component, returning to operation 302 may comprise determining and/or receiving a perception error model associated with the different version. If there is a scenario that hasn't been tested for the current scenario, returning to operation 302 may comprise executing a simulation based at least in part on the first configuration for the n-th scenario.

Otherwise, example process 300 may continue to operation 326.

At operation 326, example process 300 may comprise transmitting instructions to implement the configuration, according to any of the techniques discussed herein. Depending on the use case, transmitting instructions to implement the configuration may comprise transmitting software update(s) to an autonomous vehicle and/or causing a user interface to display a notification or message indicating details for making a hardware change to one or more components of the vehicle. The decision to transmit the instructions may be based at least in part on determining that the performance metric(s) satisfy a threshold specified by a ruleset (e.g., the reliability rate meets or exceeds a reliability threshold, the failure rate is below a failure threshold) and/or receiving an indication that an optimization algorithm and/or simulation system has successfully improved the performance metric(s) over a previous configuration of the components of the vehicle. In at least one example, transmitting instructions to implement a configuration may comprise aggregating the maximum probabilities determined for each scenario that was simulated for that configuration and determining an aggregated performance metric or likelihood of intersection associated with the configuration, such as a number of intersections per 100,000 miles driven. In an example where multiple configurations are tested according to example process 300, a configuration may be selected based at least in part on the aggregated performance metric associated therewith (e.g., a lowest number of intersections per miles driven compared to the other configurations).

FIGS. 4A & 4B illustrate graphs of a probability of intersection determined over an entire simulation execution for two simulations executed for two different configurations and a same simulation scenario. For example, the probabilities depicted in FIGS. 4A and 4B may be the overall probability of any portion of the simulated autonomous vehicle overlapping any part of any object(s) in the simulated scenario. In an example where the probabilities are calculated over the duration of the simulation, the performance metric(s) associated with a particular configuration of the one or more components may be based at least in part on a maximum probability over time. This probability would correspond to just after 10 seconds for the simulation associated with FIG. 4A and just after 5 seconds for the simulation associated with FIG. 4B. The maximum value of the probability for the first configuration is close to 0.001 whereas the maximum value of the probability for the second configuration is close to 0.0006, which indicates that, at least for this particular scenario, the second configuration is more likely to be safe, as the maximum probability of intersection is lower.

Figure 4C:
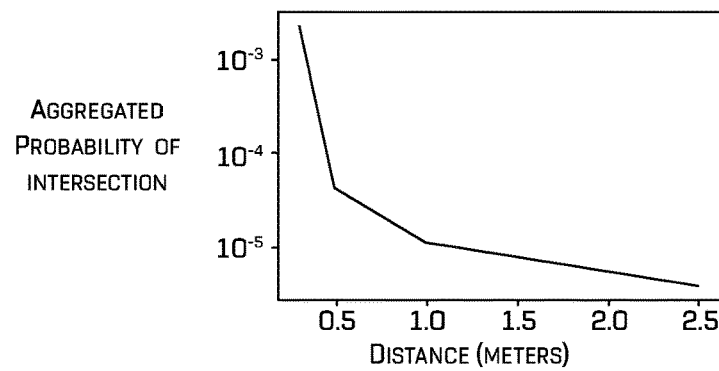
FIG. 4C depicts probabilities associated with different configurations of the autonomous vehicle, namely different minimum distances from any object that the planning component of the autonomous vehicle is permitted to generate a trajectory.

FIG. 4C depicts one example of analyzing the performance of different configurations of the autonomous vehicle. In particular, FIG. 4C illustrates aggregated probabilities associated with varying the minimum distance from any object that the planning component of the autonomous vehicle is permitted to generate a trajectory. The probabilities are "aggregated" in that the y-axis indicates an aggregation of probabilities for different simulations run for a particular minimum distance. For instance, for a minimum distance of 0.5 meters, multiple scenarios were simulated using example process 300, each simulation of which resulted in a maximum probability and/or other performance metric(s). These maximum probabilities are aggregated together (e.g., via an average, weighted average, taking the maximum probability out of all the probabilities). In the illustrated example, this aggregation results in an aggregated probability of intersection of a little less than $10^{-4}$.

Such a process may be repeated for multiple parameters that may be varied according to different configurations and a configuration may be chosen based at least in part on an optimization over the different probabilities and parameters according to a set of operational objectives. Merely minimizing the probability of intersection may lead to poor results, as, in the case of minimum distance, the minimum aggregated probability of intersection may be too large to allow the autonomous vehicle to operate. For example, imagine if the autonomous vehicle couldn't get closer than 5 meters from any object. The autonomous vehicle wouldn't be able to even stay in a lane.

The operational objectives may define threshold(s) and/or target operation characteristics that may be used as part of an optimization. For example, the operation objective may define a maximum amount of time that a scenario should take, a mission completion rate, a lateral and/or longitudinal acceleration maximum threshold, a maximum value of a minimum distance, and/or the like.

Figure 5:
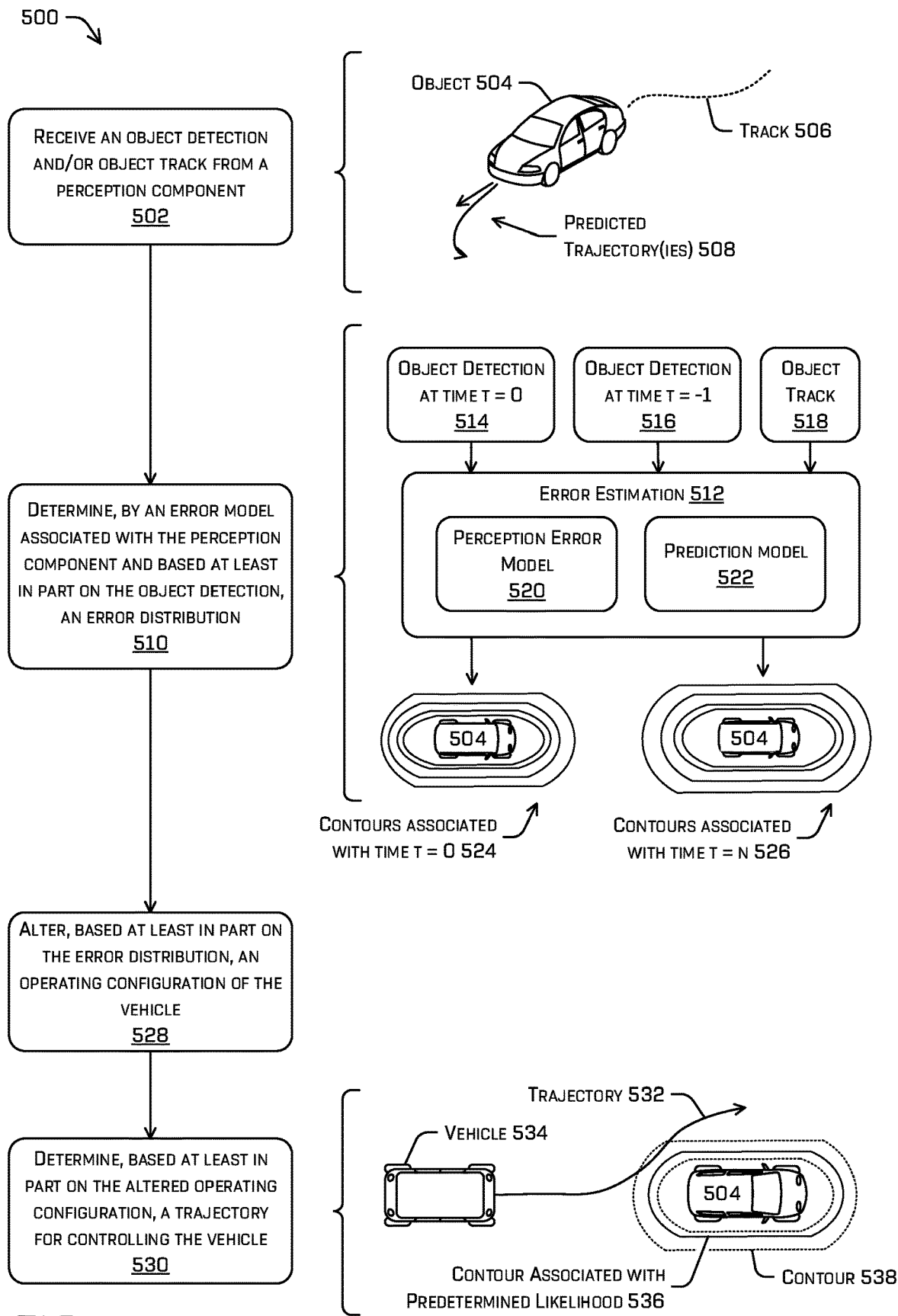
FIG. 5 illustrates a pictorial flow diagram of an example process for using a perception error model to modify an operating configuration of a vehicle based at least in part on contours or other indications of a likelihood of error of a perception component of the vehicle.

Example Process for Controlling Autonomous Vehicle Based at Least in Part on Perception Error Model FIG. 5 illustrates a flow diagram of an example process 500 for controlling an autonomous vehicle based at least in part on the output from a perception error model. In some examples, the perception error model may be part of an error estimation component that executes in tandem with the perception component to generate an indication of the likelihood that output received from the perception component comprises an error and/or an extent of the error. In some instances, the vehicle computing device(s) 204 and/or the computing device(s) 214 may each or individually accomplish all or part of example process 500.

At operation 502, example process 500 may comprise receiving an object detection and/or object track from a perception component, according to any of the techniques discussed herein. For example, the perception component may determine the object detection and/or object track based at least in part on sensor data associated with an object 504. The object detection may indicate a position, orientation, velocity, acceleration, region of interest (ROI) indicating sensor data associated with and/or space in the environment occupied by the object 504, a classification associated with the object (e.g., pedestrian, cyclist, motorcyclist, signage, traffic light, vehicle, oversized vehicle, articulating vehicle), and/or the like. A track 506 may associate one or more object detections associated with different time stamps and a same object or at least a portion of the object detections. For example, track 506 may associate an object detection associated with a most recent time and an object detection associated with a previous time that are both determined to be associated with object 504. The track may indicate more or less data than an object detection. For example, a track may additionally or alternatively indicate predicted trajectory(ies) 508, position, orientation, velocity, acceleration, and/or the like associated with the object 504. In other words, the track may associate historical, current, and/or predicted data associated with an object detected by the perception component.

Figure 6:
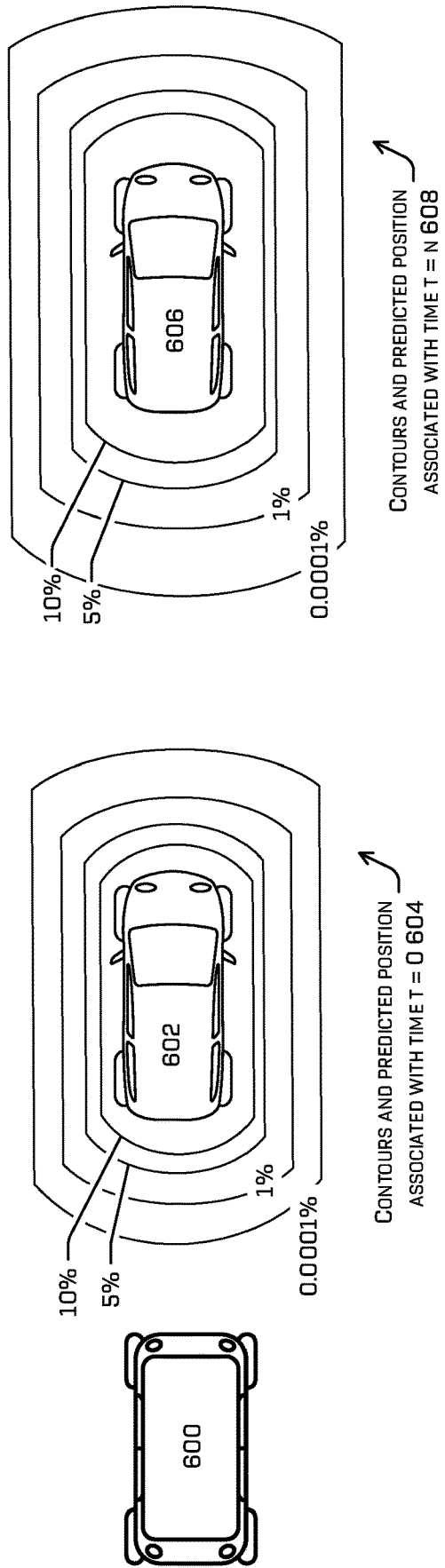
FIG. 6 illustrates a top-down illustration of a vehicle, an object detection, a set of contours associated with the object detection, a predicted object detection, and a set of contours associated with the predicted object detection.

At operation 510, example process 500 may comprise determining, by an error model associated with the perception component and based at least in part on the object detection, an error distribution associated with the detection, according to any of the techniques discussed herein. The error distribution may indicate a likelihood (e.g., a posterior probability) of error associated with the perception component, such as a likelihood of a false negative or a false positive. Operation 510 may comprise generating one or more contours, a heat map, a mask, and/or any other suitable indication for identifying a region surrounding an object detection that is associated with a particular likelihood of error. Additionally or alternatively, as in the example of a heat map, the output of the error model may be used to generate an error likelihood associated with a portion of the environment associated with the object detection. More details regarding contours are illustrated in FIG. 6.

Regardless, an error estimation component 512, which may represent error estimation component 236, may receive an object detection associated with a first time, object detection 514; an object detection associated with a second time prior to the first time, object detection 516, and/or a track 518 associated with the object. The error estimation component 512 may comprise a perception error model 520 and/or a prediction model 522. The perception error model 520 may output a mixture model and/or one or more probability distributions associated with the object detection. The error estimation component 512 may use the probability distribution(s) to determine the indication of error likelihood(s), such as contours 524 associated with a first time. In some examples, the prediction model 522 may be trained to receive the indications generated by the error estimation component 512, such as contour(s) and/or a heat map, and determine indications associated with a time later than the first time, such as a future time. For example, the prediction model 522 may output contours 526 associated with time n, a positive integer greater than zero, which is the first time in the depicted example. The illustrated example depicts four contour lines, although it is understood that the error estimation component 512 may determine more or less contour lines and that the prediction model 522 may determine more or less contour lines than those output by the error estimation component 512.

In some examples, the perception component and/or a planning component of the autonomous vehicle may use the indication generated by the error estimation component 512 to determine a distance from the object that is associated with a predetermined likelihood of error. The predetermined likelihood of error may be statically stored in memory or dynamically determined by the perception component and/or planning component based at least in part on conditions detected from sensor data (e.g., weather conditions, lighting conditions, vehicle speed, object speed, the complexity of the environment, whether other objects are being assertive or are yielding to the vehicle). In at least one example, the predetermined likelihood of error may be dynamically adjusted based at least in part on detecting an emergency, determining that an intensity of a scene meets or exceeds a threshold (e.g., there is not enough room between vehicles to navigate without altering the predetermined likelihood of error, assertive maneuvers are common in the geographic region and/or at the time of day). The predetermined likelihood of error may be determined in association with an overall intersection and/or failure risk rate that is equal to or less than a human collision and/or failure rate. In at least one example, the predetermined likelihood may be set or determined to guarantee the autonomous vehicle is less risk prone than a human drive and even an order of magnitude safer in some examples.

At operation 528, example process 500 may comprise altering, based at least in part on the error distribution, an operating configuration of the vehicle, according to any of the techniques discussed herein. For example, the planning component may, based at least in part on the indication(s) generated by the error estimation component 512 and/or the distance determined at operation 510, constrain trajectories generated by the planning component for controlling the autonomous vehicle outside a region associated with likelihood equal to or greater than the predetermined likelihood, as indicated by the contours, heat map, etc. Additionally or alternatively, operation 528 may comprise modifying or re-selecting an action generated by the planning component. For example, operation 528 may trigger the planning component to select a new action (excluding the former action) and/or to modify the former action.

In some examples, actions available for selection by the planning component may be based at least in part on a shape and/or size of the contours. For example, the larger the contours, the more limited the options may be. In some instances, operation 528 may comprise selecting a new action based at least in part on a target action. For example, the autonomous vehicle may need to change lanes in order to complete a mission, but the change lane action may be unavailable to the planning component for selection because a contour associated with an object is too large. In such an instance, the planning component may select an action to cause the autonomous vehicle to creep forward, approach the object, and/or to continue a current trajectory to increase a confidence of a prediction associated with the object, thereby shrinking the contour and unlocking the change lane action.

In additional or alternate examples, operation 528 may comprise altering operation of a component of the autonomous vehicle to increase a confidence associated with the perception data/prediction associated with the object. For example, this may comprise changing a sensor operation, such as beamforming towards the object, increasing a number of sweeps or scans in the direction of the object, zooming in on the object, and/or the like. In examples where some actions may remain locked for selection by the planning component until a contour isn't violated, the contour is a certain size/size ratio, such change of sensor operation may cause an action to become unlocked for selection.

In some examples, if a ratio of the size of a contour associated with a predetermined likelihood to the size of the object detection meets or exceeds a threshold ratio, the planning component may alter gains associated with the drive system. For example, a very large ratio may indicate that the perception component's object detection wasn't very accurate; therefore, the planning system can lower gains controlling the acceleration, decrease a maximum velocity, increase a distance away from the object detection that trajectories are generated, and/or the like.

At operation 530, example process 500 may comprise determining, based at least in part on the altered operating configuration (or altered action), a trajectory for controlling the vehicle, according to any of the techniques discussed herein. As discussed partially above, the planning component may receive the indication(s) of the likelihood(s) of error determined by the error estimation component 512 and/or distance determined therefrom, and may generate a trajectory for controlling the autonomous vehicle based at least in part on the indication(s) and/or distance. In at least one example, the planning component may discard any trajectories generated by the planning component that overlap a contour associated with a predetermining likelihood threshold and/or the planning component may constrain the search for a trajectory to a region outside the contour.

In the depicted example, the trajectory 532 generated by the planning component to control the vehicle 534 does not overlap the contour 536 associated with a predetermined likelihood, illustrated as a solid line, even though the trajectory 532 does overlap another contour 538 associated with a very low likelihood of perception error.

FIG. 6 illustrates a top-down illustration of an autonomous vehicle 600, an object detection 602, a set of contours associated with the object detection 604 depicted as lines surrounding the object detection 602, a predicted object detection 606, and a set of contours associated with the predicted object detection 608. Note that the likelihoods are depicted as percentages and indicate a likelihood that an error has occurred, although the likelihoods may take any other suitable form, such as a value between 0 and 1 that indicates that the object detection was correct. Moreover, although the contours depicted herein are uniform, the contours may depend on the sensor data, occlusions to the sensor data, the object's velocity and/or predictability, etc.

Example Clauses

A. A method comprising: generating a simulated environment comprising a simulated object; controlling a simulated autonomous vehicle to traverse the simulated environment based at least in part on a configuration of a component of the simulated autonomous vehicle; determining an error distribution associated with a perception component error model based at least in part on a state of the simulated object during the simulation; determining, based at least in part on the error distribution, a maximum probability of an intersection of the simulated autonomous vehicle with the simulated object; and determining, based at least in part on the maximum probability, a performance metric associated with the configuration.

B. method of paragraph A, wherein determining the probability of intersection comprises sampling the error distribution based at least in part on at least one of a state of the simulated autonomous vehicle or a state of the simulated object.

C. The method of either paragraph A or B, wherein: the state associated with the simulated object is determined by a perception component of the autonomous vehicle based at least in part on at least one of sensor data or simulated sensor data received by the perception component; and the state comprises at least one of: a position of the simulated object relative to a position of the simulated autonomous vehicle, extents of the simulated object, a velocity or an acceleration of the simulated object, an orientation of the simulated object, a classification of the simulated object, an estimated occlusion percentage associated with the simulated object, or a track indicating historical data associated with the simulated object.

D. The method of any one of paragraphs A-C, further comprising: training the perception error model based at least in part on a difference between a previous prediction of a perception component and a perception output of the perception component at a time associated with the prediction, wherein the previous prediction and the perception output are generated by the perception component based at least in part on sensor data and the configuration; and wherein executing the simulation comprises determining, by a planning component of the autonomous vehicle, a trajectory for controlling motion of the simulated autonomous vehicle based at least in part on ground truth perception data indicating at least one of a location, heading, velocity, acceleration, or region of interest associated with the simulated object.

E. The method of any one of paragraphs A-D, further comprising: determining an additional performance metric associated with an additional configuration based at least in part on an additional simulation; determining a difference between the performance metric and the additional performance metric; and transmitting the configuration to an autonomous vehicle based at least in part on the difference, wherein operation of the autonomous vehicle is based at least in part on the configuration.

F. The method of any one of paragraphs A-E, wherein the configuration comprises at least one of: a minimum standoff distance between a trajectory of the autonomous vehicle and an object, a maximum velocity, a maximum acceleration, one or more actions available to a planning component of the autonomous vehicle for controlling the autonomous vehicle, or a requirement to access an action by the planning component.

G. A system comprising: one or more processors; and a memory storing processor-executable instructions that, when executed by the one or more processors, cause the system to perform operations comprising: generating a simulated environment comprising a simulated object; controlling a simulated autonomous vehicle to traverse the simulated environment based at least in part on a configuration of a component of the simulated autonomous vehicle; determining an error distribution associated with a perception component error model based at least in part on a state of the simulated object during the simulation; determining, based at least in part on the error distribution, a maximum probability of an intersection of the simulated autonomous vehicle with the simulated object; and determining, based at least in part on the maximum probability, a performance metric associated with the configuration.

H. The system of paragraph G, wherein determining the probability of intersection comprises sampling the error distribution based at least in part on at least one of a state of the simulated autonomous vehicle or a state of the simulated object.

I. The system of either paragraph G or H, wherein the operations further comprise: training the perception error model based at least in part on a difference between a previous prediction of a perception component and a perception output of the perception component at a time associated with the prediction, wherein the previous prediction and the perception output are generated by the perception component based at least in part on sensor data and the configuration; and wherein executing the simulation comprises determining, by a planning component of the autonomous vehicle, a trajectory for controlling motion of the simulated autonomous vehicle based at least in part on ground truth perception data indicating at least one of a location, heading, velocity, acceleration, or region of interest associated with the simulated object.

J. The system of any one of paragraphs G-I, wherein the operations further comprise training a second perception error model based at least in part on a difference between a prediction output and a perception output of a perception component of the autonomous vehicle, wherein the prediction output and the perception output are generated by the perception component at least one of according to a second configuration or responsive to a second scenario.

K. The system of any one of paragraphs G-J, wherein the maximum probability is a first maximum probability and determining the performance metric associated with the configuration further comprises: generating a second simulated environment comprising a second simulated object; controlling the simulated autonomous vehicle to traverse the second simulated environment based at least in part on the configuration; determining a second error distribution associated with the perception component error model based at least in part on a second state of the simulated object during the simulation; determining, based at least in part on the second error distribution, a second maximum probability; and aggregating, as an aggregated probability associated with the configuration, the first maximum probability and the second maximum probability.

L. The system of any one of paragraphs G-K, wherein the aggregated probability is a first aggregated probability and the operations further comprise determining to transmit the configuration to an autonomous vehicle based at least in part on a difference between the first aggregated probability and a second aggregated probability associated with a second configuration.

M. The system of any one of paragraphs G-L, wherein the operations further comprise: determining an additional performance metric associated with an additional configuration based at least in part on an additional simulation; determining a difference between the performance metric and the additional performance metric; and transmitting the configuration to an autonomous vehicle based at least in part on the difference, wherein operation of the autonomous vehicle is based at least in part on the configuration.

N. A non-transitory computer-readable medium storing processor-executable instructions that, when executed by one or more processors, cause the one or more processors to perform operations comprising: generating a simulated environment comprising a simulated object; controlling a simulated autonomous vehicle to traverse the simulated environment based at least in part on a configuration of a component of the simulated autonomous vehicle; determining an error distribution associated with a perception component error model based at least in part on a state of the simulated object during the simulation; determining, based at least in part on the error distribution, a maximum probability of an intersection of the simulated autonomous vehicle with the simulated object; and determining, based at least in part on the maximum probability, a performance metric associated with the configuration.

O. The non-transitory computer-readable medium of paragraph N, wherein determining the probability of intersection comprises sampling the error distribution based at least in part on at least one of a state of the simulated autonomous vehicle or a state of the simulated object.

P. The non-transitory computer-readable medium of either paragraph N or O, wherein the operations further comprise: training the perception error model based at least in part on a difference between a previous prediction of a perception component and a perception output of the perception component at a time associated with the prediction, wherein the previous prediction and the perception output are generated by the perception component based at least in part on sensor data and the configuration; and wherein executing the simulation comprises determining, by a planning component of the autonomous vehicle, a trajectory for controlling motion of the simulated autonomous vehicle based at least in part on ground truth perception data indicating at least one of a location, heading, velocity, acceleration, or region of interest associated with the simulated object.

Q. The non-transitory computer-readable medium of any one of paragraphs N-P, wherein the operations further comprise training a second perception error model based at least in part on a difference between a prediction output and a perception output of a perception component of the autonomous vehicle, wherein the prediction output and the perception output are generated by the perception component at least one of according to a second configuration or responsive to a second scenario.

R. The non-transitory computer-readable medium of any one of paragraphs N-Q, wherein the maximum probability is a first maximum probability and determining the performance metric associated with the configuration further comprises: generating a second simulated environment comprising a second simulated object; controlling the simulated autonomous vehicle to traverse the second simulated environment based at least in part on the configuration; determining a second error distribution associated with the perception component error model based at least in part on a second state of the simulated object during the simulation; determining, based at least in part on the second error distribution, a second maximum probability; and aggregating, as an aggregated probability associated with the configuration, the first maximum probability and the second maximum probability.

S. The non-transitory computer-readable medium of any one of paragraphs N-R, wherein the aggregated probability is a first aggregated probability and the operations further comprise determining to transmit the configuration to an autonomous vehicle based at least in part on a difference between the first aggregated probability and a second aggregated probability associated with a second configuration.

T. The non-transitory computer-readable medium of any one of paragraphs N-S, wherein the operations further comprise: determining an additional performance metric associated with an additional configuration based at least in part on an additional simulation; determining a difference between the performance metric and the additional performance metric; and transmitting the configuration to an autonomous vehicle based at least in part on the difference, wherein operation of the autonomous vehicle is based at least in part on the configuration.

U. A method comprising: receiving sensor data representing an environment associated with a vehicle; receiving, from a perception component, an object detection determined based at least in part on the sensor data, wherein the object detection comprises an estimate of a portion of the environment occupied by an object; determining, by an error model associated with the perception component of the vehicle and based at least in part on the object detection, an error distribution associated with the detection; determining, based at least in part on the error distribution, a trajectory; and controlling the vehicle based at least in part on determining, based at least in part on the trajectory.

V. The method of paragraph U, wherein determining the trajectory based at least in part on the error distribution comprises determining a likelihood of an error associated with the perception component and wherein determining the likelihood of an error comprises: providing the object detection and a track associated with the object detection as input to the error model; and receiving one or more indications of a likelihood of error as an output from the error model, wherein: the track indicates historical data associated with the object; and the object detection comprises an indication of at least one of a position of the object, a region occupied by the object, a heading associated with the object, a classification associated with the object, a state associated with the object, or one or more confidence scores.

W. The method of either paragraph U or V, wherein the error distribution comprises a plurality of contours around the object, a contour of the plurality of contours associated with a likelihood generated by the error model.

X. The method of any one of paragraphs U-W, wherein: the contour is associated with a first time; the method further comprises determining a second contour associated with a second time later than the first time, the second contour being associated with a predicted location of the object; and determining the trajectory is further based at least in part on the second contour.

Y. The method of any one of paragraphs U-X, further comprising altering, based at least in part on the contour, at least one of an operating configuration of the autonomous vehicle or a planned action.

Z. The method of any one of paragraphs U-Y, further comprising preventing a planning component of the autonomous vehicle from selecting one or more actions based at least in part on the error distribution.

AA. A system comprising: one or more processors; and a memory storing processor-executable instructions that, when executed by the one or more processors, cause the system to perform operations comprising: receiving sensor data representing an environment associated with a vehicle; receiving, from a perception component, an object detection determined based at least in part on the sensor data, wherein the object detection comprises an estimate of a portion of the environment occupied by an object; determining, by an error model associated with the perception component of the vehicle and based at least in part on the object detection, an error distribution associated with the detection; determining, based at least in part on the error distribution, a trajectory; and controlling the vehicle based at least in part on determining, based at least in part on the trajectory.

AB. The system of paragraph AA, wherein determining the trajectory based at least in part on the error distribution comprises determining a likelihood of an error associated with the perception component and wherein determining the likelihood of an error comprises: providing the object detection and a track associated with the object detection as input to the error model; and receiving one or more indications of a likelihood of error as an output from the error model, wherein: the track indicates historical data associated with the object; and the object detection comprises an indication of at least one of a position of the object, a region occupied by the object, a heading associated with the object, a classification associated with the object, a state associated with the object, or one or more confidence scores.

AC. The system of either paragraph AA or AB, wherein the error distribution comprises a plurality of contours around the object, a contour of the plurality of contours associated with a likelihood generated by the error model.

AD. The system of any one of paragraphs AA-AC, wherein: the contour is associated with a first time; the operations further comprise determining a second contour associated with a second time later than the first time, the second contour being associated with a predicted location of the object; and determining the trajectory is further based at least in part on the second contour.

AE. The system of any one of paragraphs AA-AD, wherein the operations further comprise altering, based at least in part on the contour, at least one of an operating configuration of the autonomous vehicle or a planned action.

AF. The system of any one of paragraphs AA-AE, wherein the operations further comprise preventing a planning component of the autonomous vehicle from selecting one or more actions based at least in part on the error distribution.

AG. The system of any one of paragraphs AA-AF, wherein the operations further comprise: at least one of modifying operation of a sensor of the autonomous vehicle to decrease a likelihood of error associated with the error distribution or determining an action to reduce the likelihood of error, wherein the trajectory is based at least in part on the action; and allowing access to the one or more actions based at least in part on a second error distribution determined at a second time subsequent to a first time at which the error distribution was determined, wherein the second error distribution indicates a reduction in the likelihood of error compared to the first error distribution.

AH. A non-transitory computer-readable medium storing processor-executable instructions that, when executed by one or more processors, cause the one or more processors to perform operations comprising: receiving sensor data representing an environment associated with a vehicle; receiving, from a perception component, an object detection determined based at least in part on the sensor data, wherein the object detection comprises an estimate of a portion of the environment occupied by an object; determining, by an error model associated with the perception component of the vehicle and based at least in part on the object detection, an error distribution associated with the detection; determining, based at least in part on the error distribution, a trajectory; and controlling the vehicle based at least in part on determining, based at least in part on the trajectory.

AI. The non-transitory computer-readable medium of paragraph AH, wherein determining the trajectory based at least in part on the error distribution comprises determining a likelihood of an error associated with the perception component and wherein determining the likelihood of an error comprises: providing the object detection and a track associated with the object detection as input to the error model; and receiving one or more indications of a likelihood of error as an output from the error model, wherein: the track indicates historical data associated with the object; and the object detection comprises an indication of at least one of a position of the object, a region occupied by the object, a heading associated with the object, a classification associated with the object, a state associated with the object, or one or more confidence scores.

AJ. The non-transitory computer-readable medium of either paragraph AH or AI, wherein the error distribution comprises a plurality of contours around the object, a contour of the plurality of contours associated with a likelihood generated by the error model.

AK. The non-transitory computer-readable medium of any one of paragraphs AH-AJ, wherein: the contour is associated with a first time; the operations further comprise determining a second contour associated with a second time later than the first time, the second contour being associated with a predicted location of the object; and determining the trajectory is further based at least in part on the second contour.

AL. The non-transitory computer-readable medium of any one of paragraphs AH-AK, wherein the operations further comprise altering, based at least in part on the contour, at least one of an operating configuration of the autonomous vehicle or a planned action.

AM. The non-transitory computer-readable medium of any one of paragraphs AH-AL, wherein the operations further comprise preventing a planning component of the autonomous vehicle from selecting one or more actions based at least in part on the error distribution.

AN. The non-transitory computer-readable medium of any one of paragraphs AH-AM, wherein the operations further comprise: at least one of modifying operation of a sensor of the autonomous vehicle to decrease a likelihood of error associated with the error distribution or determining an action to reduce the likelihood of error, wherein the trajectory is based at least in part on the action; and allowing access to the one or more actions based at least in part on a second error distribution determined at a second time subsequent to a first time at which the error distribution was determined, wherein the second error distribution indicates a reduction in the likelihood of error compared to the first error distribution.

While the example clauses described above are described with respect to one particular implementation, it should be understood that, in the context of this document, the content of the example clauses can also be implemented via a method, device, system, computer-readable medium, and/or another implementation. Additionally, any of examples A-AN may be implemented alone or in combination with any other one or more of the examples A-AN.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The components described herein represent instructions that may be stored in any type of computer-readable medium and may be implemented in software and/or hardware. All of the methods and processes described above may be embodied in, and fully automated via, software code components and/or computer-executable instructions executed by one or more computers or processors, hardware, or some combination thereof. Some or all of the methods may alternatively be embodied in specialized computer hardware.

At least some of the processes discussed herein are illustrated as logical flow graphs, each operation of which represents a sequence of operations that can be implemented in hardware, software, or a combination thereof. In the context of software, the operations represent computer-executable instructions stored on one or more non-transitory computer-readable storage media that, when executed by one or more processors, cause a computer or autonomous vehicle to perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

Conditional language such as, among others, "may," "could," "may" or "might," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. may be either X, Y, or Z, or any combination thereof, including multiples of each element. Unless explicitly described as singular, "a" means singular and plural.

Any routine descriptions, elements or blocks in the flow diagrams described herein and/or depicted in the attached figures should be understood as potentially representing modules, segments, or portions of code that include one or more computer-executable instructions for implementing specific logical functions or elements in the routine. Alternate implementations are included within the scope of the examples described herein in which elements or functions may be deleted, or executed out of order from that shown or discussed, including substantially synchronously, in reverse order, with additional operations, or omitting operations, depending on the functionality involved as would be understood by those skilled in the art. Note that the term substantially may indicate a range. For example, substantially simultaneously may indicate that two activities occur within a time range of each other, substantially a same dimension may indicate that two elements have dimensions within a range of each other, and/or the like.

Many variations and modifications may be made to the above-described examples, the elements of which are to be understood as being among other acceptable examples. All such modifications and variations are intended to be included herein within the scope of this disclosure and protected by the following claims.

What is claimed is:

1. A method comprising:
    generating a simulation comprising a simulated environment and a simulated object;
    controlling a simulated autonomous vehicle to traverse the simulated environment based at least in part on a configuration of a component of the simulated autonomous vehicle;
    determining an error distribution by a perception component error model based at least in part on a state of the simulated object during the simulation, wherein the perception component error model is trained based at least in part on an object detection determined by a perception component using sensor data and wherein the error distribution comprises a plurality of contours around the simulated object;
    determining, based at least in part on the error distribution, a maximum probability of an intersection of the simulated autonomous vehicle with the simulated object; and
    determining, based at least in part on the maximum probability, a performance metric associated with the configuration.

2. The method of claim 1, wherein determining the maximum probability of intersection comprises sampling the error distribution based at least in part on at least one of a state of the simulated autonomous vehicle or a state of the simulated object.

3. The method of claim 1, wherein:
    the state associated with the simulated object is determined by a perception component of the simulated autonomous vehicle based at least in part on at least one of sensor data or simulated sensor data received by the perception component; and
    the state comprises at least one of:
    a position of the simulated object relative to a position of the simulated autonomous vehicle,
    extents of the simulated object,
    a velocity or an acceleration of the simulated object,
    an orientation of the simulated object,
    a classification of the simulated object,
    an estimated occlusion percentage associated with the simulated object, or
    a track indicating historical data associated with the simulated object.

4. The method of claim 1, further comprising:
    training the perception component error model based at least in part on a difference between a previous prediction of a perception component and a perception output of the perception component at a time associated with the previous prediction, wherein the previous prediction and the perception output are generated by the perception component based at least in part on sensor data and the configuration; and
    wherein executing the simulation comprises determining, by a planning component of the simulated autonomous vehicle, a trajectory for controlling motion of the simulated autonomous vehicle based at least in part on ground truth perception data indicating at least one of a location, heading, velocity, acceleration, or region of interest associated with the simulated object.

5. The method of claim 1, further comprising:
    determining an additional performance metric associated with an additional configuration based at least in part on an additional simulation;
    determining a difference between the performance metric and the additional performance metric; and
    transmitting the configuration to an autonomous vehicle based at least in part on the difference,
    wherein operation of the autonomous vehicle is based at least in part on the configuration.

6. The method of claim 1, wherein the configuration comprises at least one of:
    a minimum standoff distance between a trajectory of the simulated autonomous vehicle and an object,
    a maximum velocity,
    a maximum acceleration,
    one or more actions available to a planning component of the simulated autonomous vehicle for controlling the simulated autonomous vehicle, or
    a requirement to access an action by the planning component.

7. A system comprising:
    one or more processors; and
    a memory storing processor-executable instructions that, when executed by the one or more processors, cause the system to perform operations comprising:
    generating a simulation comprising a simulated environment and a simulated object;
    controlling a simulated autonomous vehicle to traverse the simulated environment based at least in part on a configuration of a component of the simulated autonomous vehicle;
    determining an error distribution by a perception component error model based at least in part on a state of the simulated object during the simulation, wherein the perception component error model is trained based at least in part on an object detection determined by a perception component using sensor data and wherein the error distribution comprises a plurality of contours around the simulated object;
    determining, based at least in part on the error distribution, a maximum probability of an intersection of the simulated autonomous vehicle with the simulated object; and
    determining, based at least in part on the maximum probability, a performance metric associated with the configuration.

8. The system of claim 7, wherein determining the maximum probability of intersection comprises sampling the error distribution based at least in part on at least one of a state of the simulated autonomous vehicle or a state of the simulated object.

9. The system of claim 7, wherein the operations further comprise:
  training the perception component error model based at least in part on a difference between a previous prediction of a perception component and a perception output of the perception component at a time associated with the previous prediction, wherein the previous prediction and the perception output are generated by the perception component based at least in part on sensor data and the configuration; and
  wherein executing the simulation comprises determining, by a planning component of the simulated autonomous vehicle, a trajectory for controlling motion of the simulated autonomous vehicle based at least in part on ground truth perception data indicating at least one of a location, heading, velocity, acceleration, or region of interest associated with the simulated object.

10. The system of claim 7, wherein the operations further comprise training a second perception error model based at least in part on a difference between a prediction output and a perception output of a perception component of the simulated autonomous vehicle, wherein the prediction output and the perception output are generated by the perception component at least one of according to a second configuration or responsive to a second scenario.

11. The system of claim 7, wherein the maximum probability is a first maximum probability and determining the performance metric associated with the configuration further comprises:
  generating a second simulated environment comprising a second simulated object;
  controlling the simulated autonomous vehicle to traverse the second simulated environment based at least in part on the configuration;
  determining a second error distribution associated with the perception component error model based at least in part on a second state of the simulated object during the simulation;
  determining, based at least in part on the second error distribution, a second maximum probability; and
  aggregating, as an aggregated probability associated with the configuration, the first maximum probability and the second maximum probability.

12. The system of claim 11, wherein the aggregated probability is a first aggregated probability and the operations further comprise determining to transmit the configuration to an autonomous vehicle based at least in part on a difference between the first aggregated probability and a second aggregated probability associated with a second configuration.

13. The system of claim 7, wherein the operations further comprise:
  determining an additional performance metric associated with an additional configuration based at least in part on an additional simulation;
  determining a difference between the performance metric and the additional performance metric; and
  transmitting the configuration to an autonomous vehicle based at least in part on the difference,
  wherein operation of the autonomous vehicle is based at least in part on the configuration.

14. A non-transitory computer-readable medium storing processor-executable instructions that, when executed by one or more processors, cause the one or more processors to perform operations comprising:
  generating a simulation comprising a simulated environment and a simulated object;
  controlling a simulated autonomous vehicle to traverse the simulated environment based at least in part on a configuration of a component of the simulated autonomous vehicle;
  determining an error distribution by a perception component error model based at least in part on a state of the simulated object during the simulation, wherein the perception component error model is trained based at least in part on an object detection determined by a perception component using sensor data and wherein the error distribution comprises a plurality of contours around the simulated object;
  determining, based at least in part on the error distribution, a maximum probability of an intersection of the simulated autonomous vehicle with the simulated object; and
  determining, based at least in part on the maximum probability, a performance metric associated with the configuration.

15. The non-transitory computer-readable medium of claim 14, wherein determining the maximum probability of intersection comprises sampling the error distribution based at least in part on at least one of a state of the simulated autonomous vehicle or a state of the simulated object.

16. The non-transitory computer-readable medium of claim 14, wherein the operations further comprise:
  training the perception component error model based at least in part on a difference between a previous prediction of a perception component and a perception output of the perception component at a time associated with the previous prediction, wherein the previous prediction and the perception output are generated by the perception component based at least in part on sensor data and the configuration; and
  wherein executing the simulation comprises determining, by a planning component of the simulated autonomous vehicle, a trajectory for controlling motion of the simulated autonomous vehicle based at least in part on ground truth perception data indicating at least one of a location, heading, velocity, acceleration, or region of interest associated with the simulated object.

17. The non-transitory computer-readable medium of claim 14, wherein the operations further comprise training a second perception error model based at least in part on a difference between a prediction output and a perception output of a perception component of the autonomous vehicle, wherein the prediction output and the perception output are generated by the perception component at least one of according to a second configuration or responsive to a second scenario.

18. The non-transitory computer-readable medium of claim 14, wherein the maximum probability is a first maximum probability and determining the performance metric associated with the configuration further comprises:
  generating a second simulated environment comprising a second simulated object;
  controlling the simulated autonomous vehicle to traverse the second simulated environment based at least in part on the configuration;
  determining a second error distribution associated with the perception component error model based at least in part on a second state of the simulated object during the simulation;

determining, based at least in part on the second error distribution, a second maximum probability; and aggregating, as an aggregated probability associated with the configuration, the first maximum probability and the second maximum probability.

19. The non-transitory computer-readable medium of claim 18, wherein the aggregated probability is a first aggregated probability and the operations further comprise determining to transmit the configuration to an autonomous vehicle based at least in part on a difference between the first aggregated probability and a second aggregated probability associated with a second configuration.

20. The non-transitory computer-readable medium of claim 14, wherein the operations further comprise:

determining an additional performance metric associated with an additional configuration based at least in part on an additional simulation;

determining a difference between the performance metric and the additional performance metric; and transmitting the configuration to an autonomous vehicle based at least in part on the difference, wherein operation of the autonomous vehicle is based at least in part on the configuration.

* * * * *